United States Patent
Nagamura et al.

(10) Patent No.: US 7,582,397 B2
(45) Date of Patent: Sep. 1, 2009

(54) PHOTOMASK, AND METHOD AND APPARATUS FOR PRODUCING THE SAME

(75) Inventors: Yoshikazu Nagamura, Hyogo (JP); Kouji Tange, Hyogo (JP); Kouki Hayashi, Tokyo (JP); Hidehiro Ikeda, Tokyo (JP)

(73) Assignee: Renesas Technology Corp., Tokyo (JP)

( * ) Notice: Subject to any disclaimer, the term of this patent is extended or adjusted under 35 U.S.C. 154(b) by 225 days.

(21) Appl. No.: 11/878,972

(22) Filed: Jul. 30, 2007

(65) Prior Publication Data
US 2009/0042106 A1 Feb. 12, 2009

Related U.S. Application Data

(62) Division of application No. 10/714,362, filed on Nov. 17, 2003, now Pat. No. 7,264,905.

(30) Foreign Application Priority Data

Jan. 31, 2003 (JP) .......................... P2003-024125

(51) Int. Cl.
*G03F 1/00* (2006.01)
(52) U.S. Cl. ......................................................... 430/5
(58) Field of Classification Search ...................... 430/5, 430/394; 356/237.2, 237.5; 250/492.21, 250/492.22, 492.3
See application file for complete search history.

(56) References Cited

U.S. PATENT DOCUMENTS 5,464,713 A 11/1995 Yoshioka et al.
5,858,625 A 1/1999 Nakao
6,042,738 A 3/2000 Casey, Jr. et al.
6,333,130 B1 12/2001 Morishige
6,821,686 B2 11/2004 Nakayama

FOREIGN PATENT DOCUMENTS

| | | |
|---|---|---|
| CN | 1261458 A | 7/2000 |
| JP | 60-245135 | 12/1985 |
| JP | 04-26846 | 1/1992 |
| JP | 04-155339 | 5/1992 |

(Continued)

OTHER PUBLICATIONS

German Office Action in corresponding German Patent Application No. DE 10 2004 004 854.1-51, dated Dec. 19, 2006.

(Continued)

*Primary Examiner*—Stephen Rosasco
(74) *Attorney, Agent, or Firm*—McDermott Will & Emery LLP

(57) ABSTRACT

A shading area having a transmissivity in the range of 0 to 2% is formed at the center of a clear defect in a wiring pattern of a half tone mask. Semitransparent areas having a transmissivity in the range of 10 to 25% are formed, adjacently to shading area, in areas extending from the inside of the edge of an imaginary pattern having no defect to the outside of the edge. In this way, in the correction of the defect in the half tone mask, the working accuracy tolerable margin of the correction portion of the defect can be made large.

8 Claims, 22 Drawing Sheets

FOREIGN PATENT DOCUMENTS

| | | |
|---|---|---|
| JP | 06-148866 | 5/1994 |
| JP | 6-347994 | 12/1994 |
| JP | 07-219211 | 8/1995 |
| JP | 09-080741 | 3/1997 |
| JP | 11-307420 | 11/1999 |
| JP | 2002-107913 A | 4/2002 |
| JP | 2003-302747 | 10/2003 |
| KR | 1997-48991 | 7/1997 |
| KR | 1998-10602 | 4/1998 |

OTHER PUBLICATIONS

Japanese Notice of Grounds of Rejection, with an English translation thereof, issued in Patent Application No. 2003-024125 dated on Aug. 19, 2008.

METHOD OF COMPARATIVE EMBODIMENT

METHOD OF THE PRESENT INVENTION

PHOTOMASK, AND METHOD AND APPARATUS FOR PRODUCING THE SAME

This application is a Divisional of U.S. application Ser. No. 10/714,362, filed Nov. 17, 2003 now U.S. Pat. No. 7,264,905, claiming priority of Japanese Application No. 2003-024125, filed Jan. 31, 2003, the entire contents of each of which are hereby incorporated by reference.

BACKGROUND OF THE INVENTION

1. Field of the Invention

The present invention relates to a photomask used in a lithographic process, a method for producing the same, and an apparatus for producing the same.

2. Description of the Background Art

Hitherto, a photomask wherein a shading pattern (semitransparent film) is formed on a surface of a transparent substrate has been used in the lithographic step for semiconductor devices. In the shading film pattern of this photomask, a clear defect such as a pattern chipping or a pinhole may be generated.

In this case, a focused ion beam (FIB) is radiated onto the clear defect in the atmosphere of organic gas, thereby correcting the clear defect. According to this correction, a carbon film whose transmissivity is about 0% to the exposure wavelength used when the photomask is used in a lithographic step is deposited on the clear defect portion. By the carbon film, the clear defect portion is corrected.

For example, in the correction (repaired) of a clear defect in a halftone (abbreviated to "HT" hereinafter) mask for devices which is used at an exposure wavelength of 248 nm and has a design size of 150 nm, an FIB radiation apparatus wherein the accelerating voltage thereof is 20 KeV is used to form a carbon film having such a thickness that gives a transmissivity of about 1% or less to light having a wavelength of 248 nm. However, the correction working accuracy, that is, the location accuracy of the carbon film to be formed in the clear defect portion is, at best, within the range of about ±50 nm from a target location.

In an HT mask for devices which has a design size of 130 nm, the correction working accuracy of a clear defect portion needs to be within the range of about ±30 nm from a target location in order to suppress the dimensional fluctuation of a pattern on a wafer into a tolerable range. Therefore, sufficient working accuracy cannot be obtained according to the above-mentioned FIB radiation apparatus. As a result, about the location, size and shape of a pattern wherein the correction portion of a clear defect is transferred onto a wafer, a dimensional error of pattern on a wafer is generated to such a degree that a bad effect on device performance is produced. For example, in the case of a wire pattern, the wire may break.

Thus, a new apparatus for correcting a clear defect has been developed instead of the above-mentioned FIB radiation apparatus. In this correcting apparatus, the accelerating voltage thereof is made high up to 30 KeV so that the diameter of the beam becomes smaller. As a result, the working accuracy for correcting a clear defect is improved. Accordingly, about the location, size and shape of a pattern wherein the correction portion of a clear defect is transferred onto a wafer, a dimensional error of the pattern on a wafer is not generated to such a degree that a bad effect on device performance is produced.

In an HT mask, the phase effect, which is the effect of reversing the phase of light transmitted through its HT film and the phase of light transmitted through the quartz transmission portion of its transparent substrate by 180°, is used to make the optical intensity of the contour of the pattern edge portion of the HT film the conspicuous. In other words, interference between light transmitted through the HT film and the light transmitted through the quartz transmission portion of the transparent substrate is used to improve pattern resolution between the pattern of the HT film and the pattern of the quartz transmission portion of the transparent substrate.

For this reason, in the case that a carbon film having a transmissivity of about 0%, about which the phase effect is not utilized as in the above-mentioned defect correcting method, is used to correct a clear defect, the pattern resolution as can obtained when the HT film is used cannot be obtained.

After transferring the pattern on the photomask onto a wafer, a dimensional error (transfer error) of a pattern on a wafer is generated about location, size and shape. In a dimensional error, the correction portion of a clear defect on the photomask is contained. On the basis of the dimensional error of a pattern on a wafer, a working accuracy tolerance margin, which is a margin which is tolerable for the location, size and shape of the correction portion of the pattern on the photomask, is decided. In the above-mentioned correcting apparatus, a shading film is used in the correction portion. Therefore, the working accuracy tolerance margin is smaller than in the case that an HT film is used in the correction portion.

Furthermore, patterns of semiconductor devices have been made minuter and wavelengths to which wafers are exposed have been made shorter; therefore, a dimensional fluctuation tolerance margin, which corresponds to working accuracy of the location, size and shape of a shading pattern itself on a photomask, has been made small. With this, the above-mentioned working accuracy tolerance margin of a correction portion is also made small. As a result, the working accuracy of correction portions in the above-mentioned defect correcting apparatus cannot satisfy the working accuracy (which is) required (necessary) to correct a defect on HT masks.

As described above, according to the conventional method of correcting a clear defect in an HT mask (i.e., a clear defect on a substrate of an HT mask), the clear defect is corrected by the deposition of a carbon film about which the phase effect cannot be used for any defect correction portion, the carbon film having a transmissivity of about 0% to an exposure wavelength. Therefore, the working accuracy tolerance margin of the correction portion becomes small, which causes an error in the size and shape of a device pattern transferred on a wafer (the error resulting from the location accuracy, the edge shape and the skirt-trailing of the carbon film formed on the photomask). The error negatively impacts the performance of the semiconductor device.

SUMMARY OF THE INVENTION

An object of the present invention is to provide a photomask making it possible to make large the working accuracy tolerance margin of the correction portion of a defect in defect correction of an HT mask, a method for producing the photomask, and an apparatus for producing the photomask.

A photomask according to a first aspect of the present invention includes: a transparent substrate; a semitransparent film or shading film provided on the transparent substrate; a clear defect portion being a missing portion of a complete pattern that should be formed when it is assumed that the semitransparent film or the shading film is completely well formed; a shading portion, having a transmissivity of 0 to 2% or 2 to 6%, formed in the clear defect portion; and a semitransparent portion, formed in the peripheral portion of the shading portion, having a transmissivity larger than that of the shading portion.

According to the above-mentioned aspect, the adjustment of the arrangement and the transmissivity of the semitransparent portion formed in a defect portion and in the vicinity thereof makes it possible to correct the photomask in such a manner that a corrected pattern is transferred onto a semiconductor substrate so as to be approximately a complete pattern.

In general, in the case that the adjustment of the arrangement of a shading portion having a transmissivity of about 0% causes a pattern approximate to the complete pattern to be transferred onto a semiconductor substrate, an arrangement error of the shading portion produces a serious effect on the arrangement, shape or dimension of the pattern transferred onto the semiconductor substrate.

However, the effect of an arrangement error of the semitransparent portion on the pattern transferred onto a semiconductor substrate is smaller than the effect of the arrangement error of the shading portion on the arrangement, shape or dimension of the pattern transferred onto a semiconductor substrate. Accordingly, the margin of the arrangement of the semitransparent portion can be made larger than the margin of the arrangement of the shading portion.

As a result, in the case where the photomask, with its clear defect portion corrected by the semitransparent portion, is used to transfer a pattern corresponding to the clear defect portion onto a semiconductor substrate, the rate of occurrence of dimensional fluctuation of the transferred pattern on the semiconductor substrate can be made small. Accordingly, the yield of semiconductor devices can be improved.

A photomask according to a second aspect of the present invention includes: a transparent substrate; a semitransparent film or shading film provided on the transparent substrate; a defect portion being a missing portion of a complete pattern that should be formed when it is assumed that the semitransparent film or shading film is completely well formed; and a semitransparent portion provided in the defect portion and in the vicinity thereof.

According to the above-mentioned aspect, an opaque defect is removed and subsequently the semitransparent portion is formed in the removed portion, whereby the opaque defect can be corrected. As a result, the margin of the arrangement of the semitransparent portion can be made large in the same way as in the case of the above-mentioned clear defect correction.

In the photomask, it is desirable the transmissivity of the semitransparent portion is larger than that of the semitransparent film.

The above-mentioned photomask can be produced by use of the following photomask producing apparatus.

A photomask producing apparatus according to a first aspect of the present invention is a defect correcting apparatus for correcting a clear defect in a photomask wherein a semitransparent film or first shading film is formed on a transparent substrate.

The defect correcting apparatus includes: a detector for detecting the location, shape and dimension of a pattern of the semitransparent film or shading film; and a comparator for comparing the pattern detected by the detector with an imaginary pattern that should be formed on a photomask and includes no defect.

The defect correcting apparatus also includes a radiation source for radiating a focused ion beam or laser beam to an area required for correcting the clear defect portion generated in the pattern, the area being recognized on the basis of comparative results from the comparator, a gas supplying mechanism for supplying gas into the clear defect portion for depositing a second shading film having a transmissivity of about 0 to 2% or 0 to 6%, and a controller for controlling a location where the focused ion beam or laser beam is radiated onto the photomask.

The controller has therein a program for carrying out a control for radiating the focused ion beam or laser beam onto the transparent substrate in such a manner that after the deposition of the second shading film, a semitransparent portion having a transmissivity larger than that of the second shading film is formed in the peripheral portion of the second shading film.

The photomask producing apparatus according to a second aspect of the present invention is a defect correcting apparatus for correcting an opaque defect in a photomask wherein a semitransparent film or shading film is formed on a transparent substrate. This defect correcting apparatus includes: a detector for detecting the location, shape and dimension of a pattern of the semitransparent film or shading film; and a comparator for comparing the pattern detected by the detector with an imaginary pattern that should be formed on a photomask and includes no defect.

This defect correcting apparatus also includes a radiation source for radiating a focused ion beam or laser beam to an area required correcting the opaque defect portion generated in the pattern, the area being recognized on the basis of comparative results from the comparator, and a controller for controlling a location where the focused ion beam or laser beam is radiated onto the photomask.

The controller has therein a program for carrying out a control for radiating the focused ion beam or laser beam onto the transparent substrate in such a manner that a semitransparent portion having a transmissivity larger than that of the semitransparent film or shading film is formed in the opaque portion and the vicinity thereof where the semitransparent film or shading film is removed.

The foregoing and other objects, features, aspects and advantages of the present invention will become more apparent from the following detailed description of the present invention when taken in conjunction with the accompanying drawings.

DESCRIPTION OF THE PREFERRED EMBODIMENTS

Figure 1:
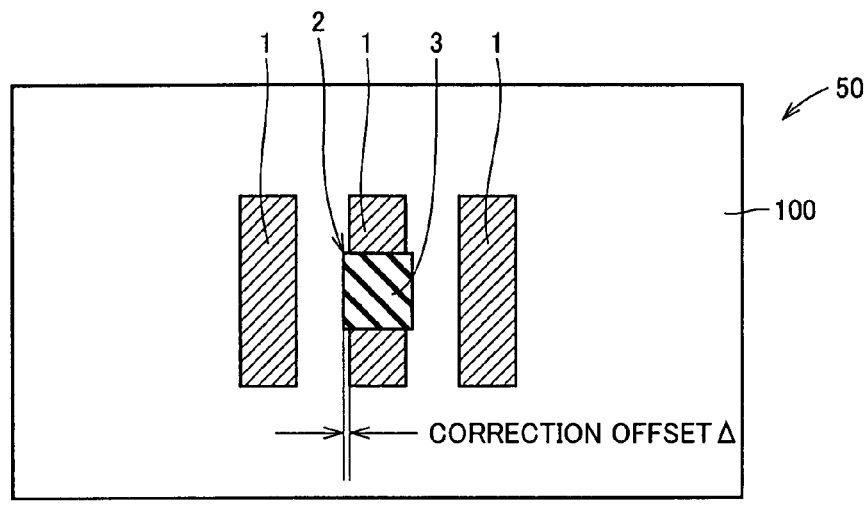
FIG. 1 is a view for describing a method for correcting a clear defect in a wiring pattern on an HT mask according to a comparative embodiment.

Referring to the drawings, the following will describe embodiments of the photomask of the present invention, the method for producing the photomask, and the apparatus for producing the photomask.

First Embodiment

In order to compare the method for correcting a photomask according to the present embodiment with a method for correcting a photomask according to a comparative embodiment, the method for correcting a photomask according to the comparative embodiment will be specifically described. An HT mask as the photomask used in this correcting method according to the comparative embodiment will be described referring to FIG. 1. In this photomask, a wire-breaking defect, which is one example of clear defects, generated in a wiring pattern on the HT mask is corrected, as illustrated in FIG. 1.

The HT mask illustrated in FIG. 1 is used at an exposure wavelength of 284 nm. This HT mask is composed of wiring patterns 1 (semitransparent film) having a width of 0.52 µm and space patterns formed between wiring patterns 1 in such a manner that the ratio between their widths is 1/1. In the method for correcting a defect according to the comparative embodiment, the portion of the defect is corrected by depositing a carbon film 3 on a clear defect portion 2, in which wiring pattern 1 breaks.

As to the photomask having this pattern, a difference between the edge location of the carbon film 3 and the edge location of an imaginary pattern that should be formed when it is assumed that no defect is generated is called correction offset. The correction offset is obtained by representing the length of the carbon film projected from the edge location of the imaginary pattern as a positive value.

Figure 2:
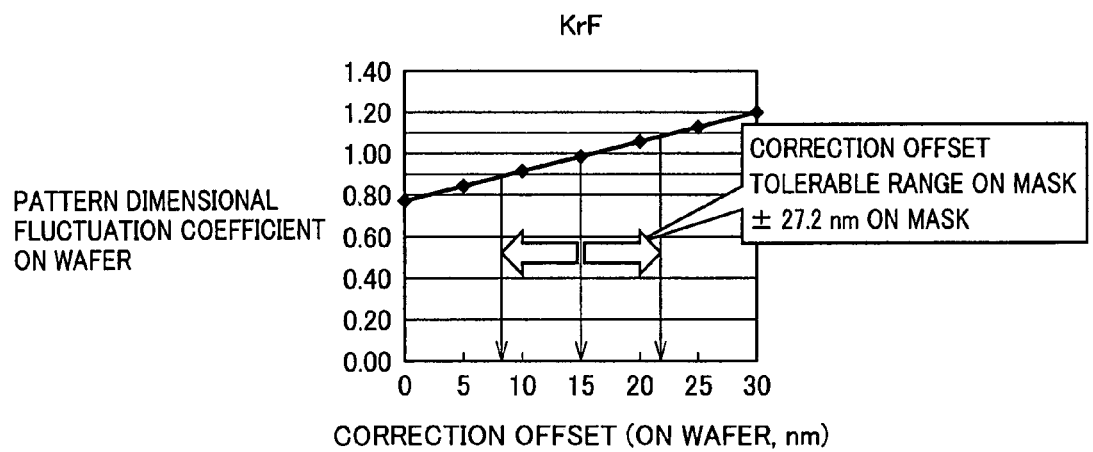
FIG. 2 is a graph showing a relationship between the dimensional fluctuation coefficient of a pattern on a wafer and correction offset in the case of using light having a wavelength of 248 nm in the clear defect correcting method of the comparative embodiment.

When a relationship between the correction offset of carbon film 3 on a transparent substrate 100 and the dimensional fluctuation coefficient of the pattern on a wafer is estimated by optical intensity simulation, a relationship as shown in FIG. 2 is obtained. The dimensional fluctuation coefficient is defined as the ratio of the dimension of a pattern transferred on a wafer to that of an imaginary pattern. Conditions for the simulation are as follows: wavelength: 248 nm; numerical aperture (NA) of the exposure apparatus: 0.68; transmissivity of wiring pattern 1 as the semitransparent film: 6%; transmissivity of carbon film 3: 0%; and defect size: 0.52 µm×0.8 µm.

The target dimension of the pattern obtained by transferring the pattern on photomask 50 onto the wafer is 130 nm, which is ¼ of the dimension of the pattern on photomask 50. In the present specification, the target dimension of a pattern has the following meaning: when the pattern is formed to have the target dimension, the target dimension makes the pattern up to the best pattern. It is tentatively stipulated that the range of the dimensional fluctuation of the pattern on the wafer is the range within ±10% of the target dimension. As a result, the tolerable range of the correction offset of carbon film 3 on photomask 50 is the range from +33.6 nm (+8.4 nm, which is ¼ of +33.6 nm, on the wafer) to +88 nm (+22.0 nm, which is ¼ of +88 nm, on the wafer). The range on the photomask of the correction offset has a span of 54.4 nm.

In short, in order to set the dimensional fluctuation coefficient of the pattern transferred on the wafer within the range of 0.9 to 1.1 as illustrated in FIG. 2, the tolerable range of the correction offset on a photomask needs to have a span of ±27.2 nm from the best correction offset that produces the best dimension on a wafer. This span value corresponds to a value four times larger than the range shown by arrows the interiors of which are white in FIG. 2.

In order to describe another example of the comparative embodiment, the HT mask having the pattern illustrated in FIG. 1 is used as an exposure wavelength of 193 nm. In this case, this HT mask is also composed of wiring patterns 1 (semitransparent film) having a width of 0.4 μm and space patterns formed between wiring patterns 1 in such a manner that the ratio between their widths is 1/1. In the same manner as in the above-mentioned comparative embodiment, in the method for correcting a defect according to the present comparative embodiment, the portion of the defect is corrected by depositing carbon film 3 on clear defect portion 2, in which the wiring pattern 1 breaks.

About the photomask having this pattern, a difference between the edge location of the carbon film 3 and the edge location of an imaginary pattern formed in case in which it is assumed that no defect is generated is called correction offset. The correction offset is obtained by representing the length of the carbon film projected from the edge location of the imaginary pattern as a positive value.

Figure 3:
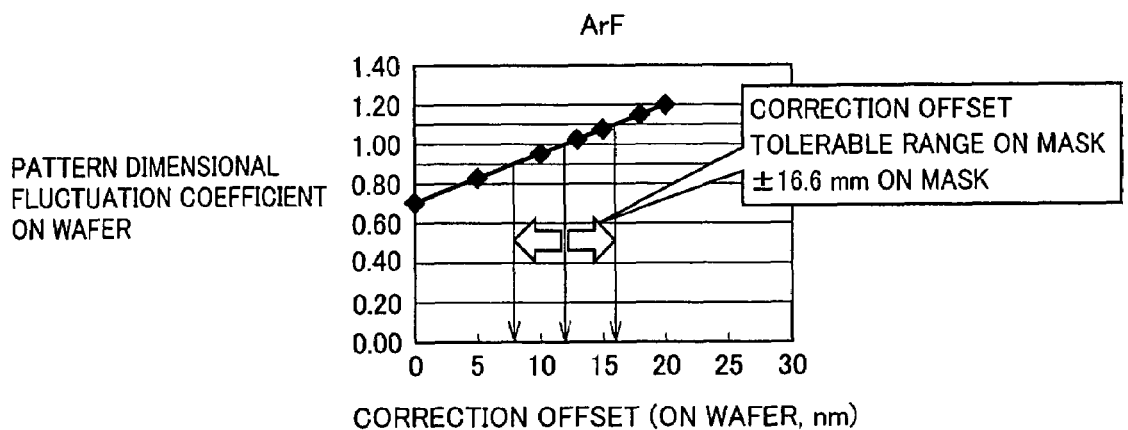
FIG. 3 is a graph showing a relationship between the dimensional fluctuation coefficient of a pattern on a wafer and correction offset in the case of using light having a wavelength of 193 nm in the clear defect correcting method of the comparative embodiment.

When a relationship between the correction offset of carbon film 3 on transparent substrate 100 and the dimensional fluctuation coefficient of the pattern on a wafer is estimated by optical intensity simulation, a relationship as shown in FIG. 3 is obtained. The dimensional fluctuation coefficient is defined as the ratio of the dimension of a pattern transferred on a wafer to that of an imaginary pattern. Conditions for the simulation are as follows: wavelength: 193 nm; numerical aperture (NA) of the exposure apparatus: 0.68; transmissivity of wiring pattern 1 as the semitransparent film: 6%; transmissivity of carbon film 3: 0%; and defect size: 0.4 μm×0.8 μm.

The target dimension of the pattern obtained by transferring the pattern on photomask 50 onto the wafer is 100 nm, which is ¼ of the dimension of the pattern on photomask 50. It is tentatively stipulated that the tolerable range of the dimensional fluctuation of the pattern on the wafer is the range within ±10% of the target dimension. As a result, the tolerable range of the correction offset of carbon film 3 on photomask 50 is the range from +31.2 nm (+7.8 nm on the wafer) to +64.4 nm (+16.1 nm on the wafer). The range on the photomask has a span of ±16.1 nm (±33.2 nm on the wafer).

In short, in order to set the dimensional fluctuation coefficient of the pattern transferred on the wafer within the range of 0.9 to 1.1 as illustrated in FIG. 3, the tolerable range of the correction offset needs to have a span of ±16.6 nm from the best correction offset that produces the best dimension on a wafer. This span value corresponds to a value four times larger than the range shown by arrows the interiors of which are white in FIG. 3. Accordingly, in the case that a wiring pattern having a width of 0.1 μm is formed on a wafer at an exposure wavelength of 193 nm, the tolerable range of the correction offset on the photomask is smaller by about 20 nm than in the case that a wiring pattern having a width of 0.13 μm is formed on a wafer at an exposure wavelength of 248 nm.

In the case that an HT mask is used under an exposure condition of either of the above-mentioned exposure wavelengths of 248 nm and 193 nm, the correction offset, on the photomask, optimal for producing the pattern on a wafer of a target dimension is a positive value when a wire-breaking clear defect in the wiring pattern on the HT mask is corrected by carbon film 3 having a transmissivity of about 0%. That is, carbon film 3 projects from the edge location of the imaginary pattern having no defects.

Figure 4:
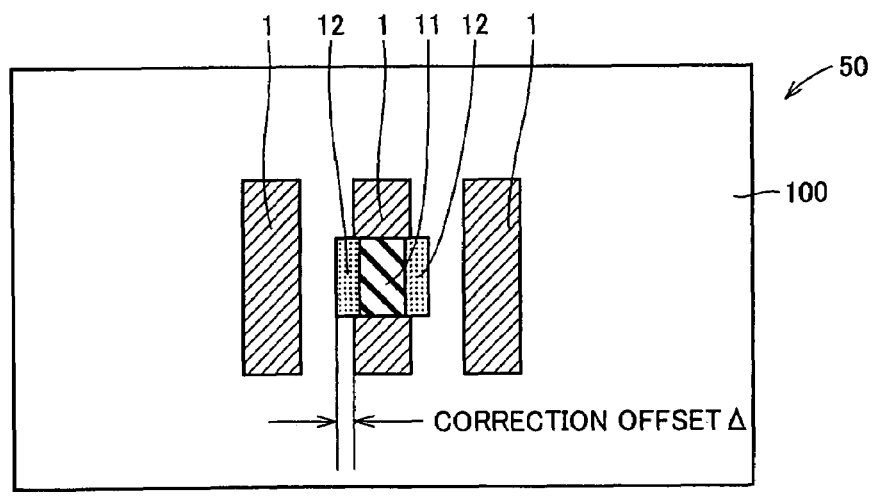
FIG. 4 is a view for describing a method for correcting a clear defect in a wiring pattern on an HT mask according to a first embodiment.

Referring to FIG. 4, the following will describe a photomask wherein the defect correcting method of the present embodiment is performed for a wire-breaking defect portion of a wiring pattern having a width of 0.4 μm on the above-mentioned HT mask used at an exposure wavelength of 193 nm. In the clear defect correcting method of the present embodiment, a shading area 11 having a transmissivity of about 0% is formed at the center of the clear defect in wiring pattern 1 of the HT mask. In the present specification, the wording "the transmissivity is about 0%" means that the transmissivity is within the range of 0 to 2%. In the clear defect correcting method of the present embodiment, semitransparent areas 12, through which light is transmitted and which is adjacent to shading area 11, are formed from the vicinity of the edge of the imaginary pattern has no defects to the outside of the pattern. The transmissivity of this semitransparent area is within the range of 10 to 25%.

For example, in photomask 50 of the present embodiment, shading area 11 having a width of 0.2 μm and a transmissivity of about 0% is formed at the center of a wiring pattern having a height (width) of 0.4 μm. In photomask 50 are formed semitransparent areas 12, which are at both sides of shading area 11, have a transmissivity of 15%, and have no difference in the phase of transmitted light from a light transmitting portion made of quartz as a transparent substrate 100.

Figure 5:
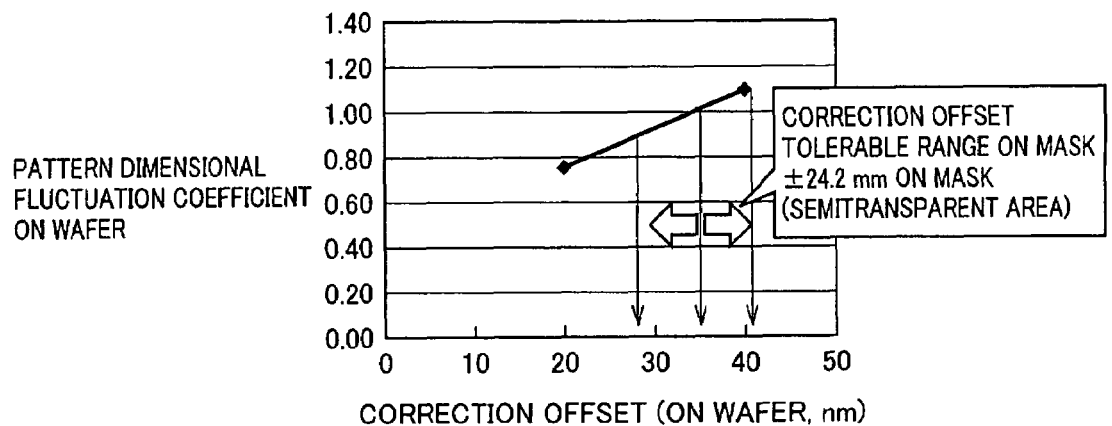
FIG. 5 is an example of a graph showing a relationship between the dimensional fluctuation coefficient of a pattern on a wafer and correction offset in the clear defect correcting method according to the first embodiment.

When a relationship between the correction offset in the case of changing the width of semitransparent areas 12 successively and the dimensional fluctuation coefficient of the pattern on a wafer is estimated by optical intensity simulation, results shown in FIG. 5 are obtained.

The range of ±10% from the target dimension 0.1 μm of the pattern formed on the wafer is defined as a transfer error range tolerable for the pattern. In this case, the width of semitransparent areas 12 formed on photomask 50 is within the range of 114 nm (28.5 nm on the wafer) to 162.4 nm (40.6 nm on the wafer). For this reason, a required range of the working accuracy of semitransparent areas 12 is within the range of ±24.2 nm from the best location of the edge of the semitransparent area 12 that produces the transferred pattern of the target dimension on a wafer. The working accuracy is designed as the length of the semitransparent area 12 projected from the edge location of the imaginary pattern. Accordingly, the margin of the working accuracy of semitransparent areas 12 is larger than the margin (±16.6 nm) of the working accuracy of carbon film 3 on the mask in the above-mentioned comparative embodiment by 7.6 nm on each of both the sides. That is, the margin of working accuracy in the mask correcting method according to the present embodiment is about 46% larger than the margin (±16.6 nm) of working accuracy in the photomask correcting method in the prior art.

Figure 6:
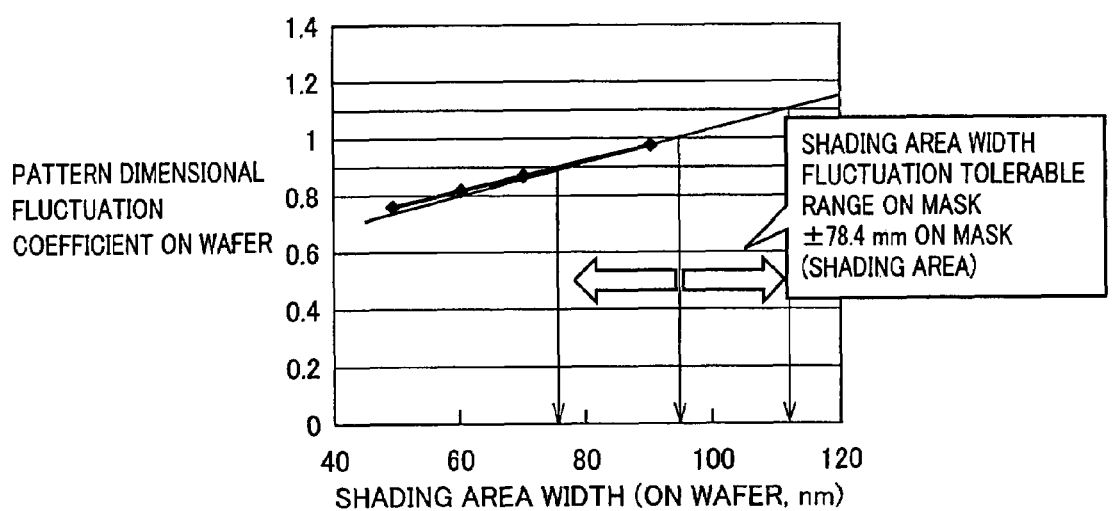
FIG. 6 is another example of a graph showing a relationship between the dimensional fluctuation coefficient of a pattern on a wafer and correction offset in the clear defect correcting method according to the first embodiment.

The width, projected from the imaginary edge, of semitransparent area 12 wherein the transmissivity thereof is 15% and the phase difference thereof from transparent substrate 100 is 5° is fixed to 80 nm. In this state, the width of shading area 11 which is to be formed at the center of the clear defect and has a transmissivity of about 0% is varied. In this case, a relationship between the correction offset and the dimensional fluctuation coefficient of the pattern on a wafer is estimated by optical simulation. The results are shown in FIG. 6.

When the tolerable range of the dimension of the pattern transferred on the wafer is set to within the range of ±10% of the target dimension in the same manner as the tolerable range of the above-mentioned pattern dimension, the tolerable range of the width of shading area 11, which is formed in the vicinity of the center of the clear defect in the photomask and has a transmissivity of about 0%, is from 0.304 µm (75.9 nm on the wafer) to 0.460 µm (115.1 nm on the wafer). Accordingly, the fluctuation of the width of shading area 11 on the mask is tolerable within the range of ±78.4 nm from the target dimension. As a result, the margin of working accuracy is about 136% larger than the working accuracy range (i.e., the range of ±16.6 nm), on the mask, which is required in the case that the clear defect is corrected only by carbon film 3 having a transmissivity of 0% in the comparative embodiment.

Figure 7:
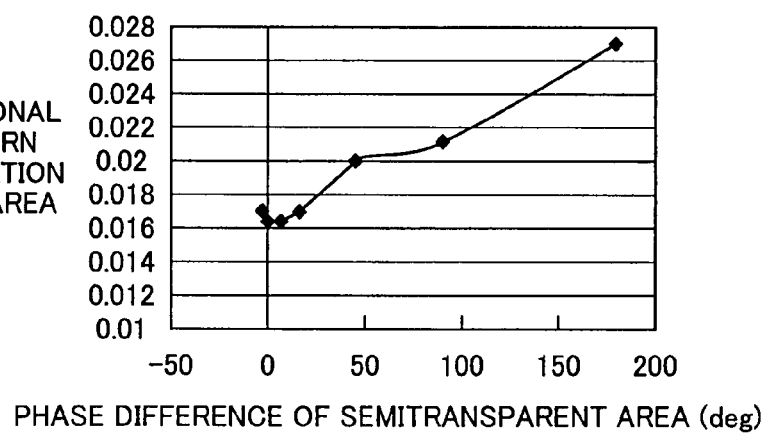
FIG. 7 is a graph showing a relationship between fluctuation in the dimension of a pattern on a wafer to fluctuation in the width of a semitransparent area and the difference between the phase of light transmitted through the semitransparent area and the phase of light transmitted through a transparent area.

The following case will be supposed: the case of fixing the width of shading area 11 which is formed in the vicinity of the center of the clear defect and having a transmissivity of about 0% to 0.2 µm and changing the phase difference of semitransparent areas (the transmissivity thereof being fixed to 15%) 12 adjacent to shading area 11 from transparent substrate 100. When the error tolerated for semitransparent areas 12 in this case is estimated by optical simulation, the results are shown in FIG. 7. Therefore, as the phase difference of semitransparent areas 12 from transparent substrate 100 is made from 180° closer to 0°, the ratio of the dimensional fluctuation of the pattern on the wafer to the fluctuation of the width of semitransparent areas 12 becomes smaller. That is, as the phase difference of semitransparent areas 12 to transparent substrate 100 is made from 180° closer to 0°, the tolerable range of an error made in the width of semitransparent areas 12 becomes wider.

The embodiment described herein is a mere example. Thus, the transmissivity of shading area 11, the phase difference thereof from transparent substrate 100, the width thereof, the transmissivity of adjacent semitransparent areas 12, the phase difference thereof from transparent substrate 100, and the width thereof can be changed dependently on characteristics of the photomask (for example, the transmissivity, pattern location, shape and dimension of wiring pattern 1 as a semitransparent film), the location, shape and dimension of the defect, and so on.

Figure 8:
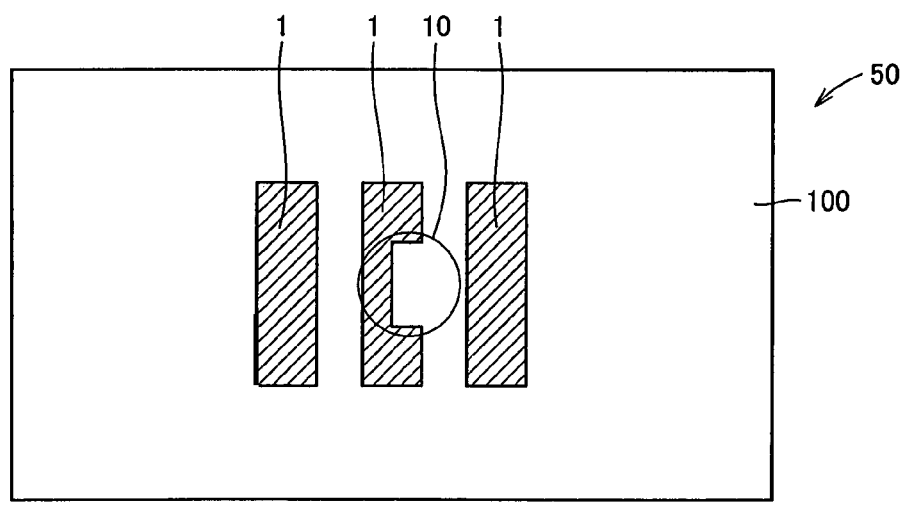
FIG. 8 is a view illustrating an example of a clear defect formed in a photomask.
Figure 9:
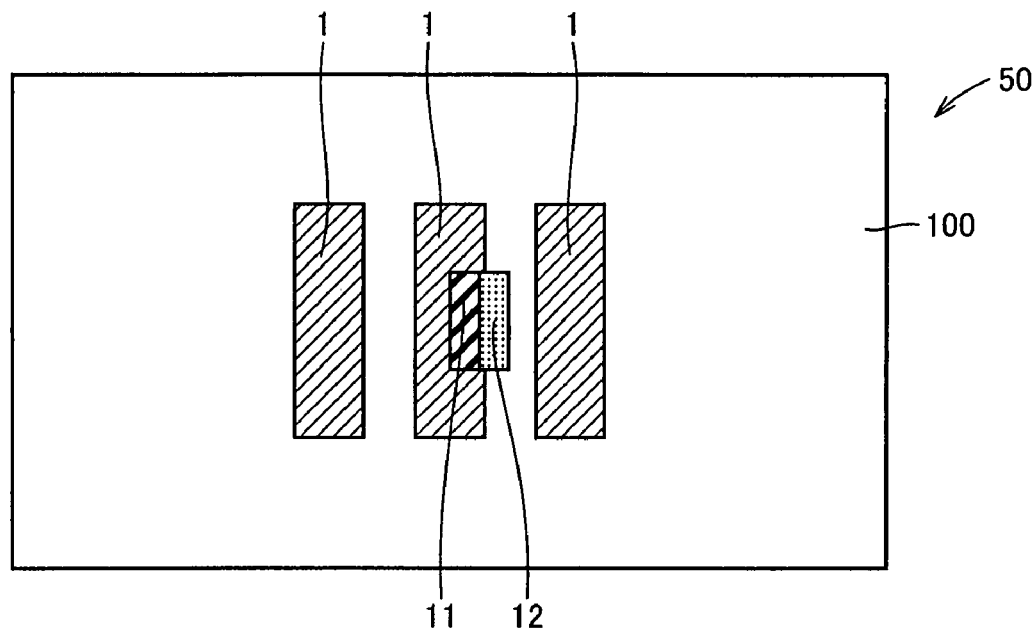
FIG. 9 is a view illustrating the photomask wherein the clear defect illustrated in FIG. 8 is corrected.
Figure 10:
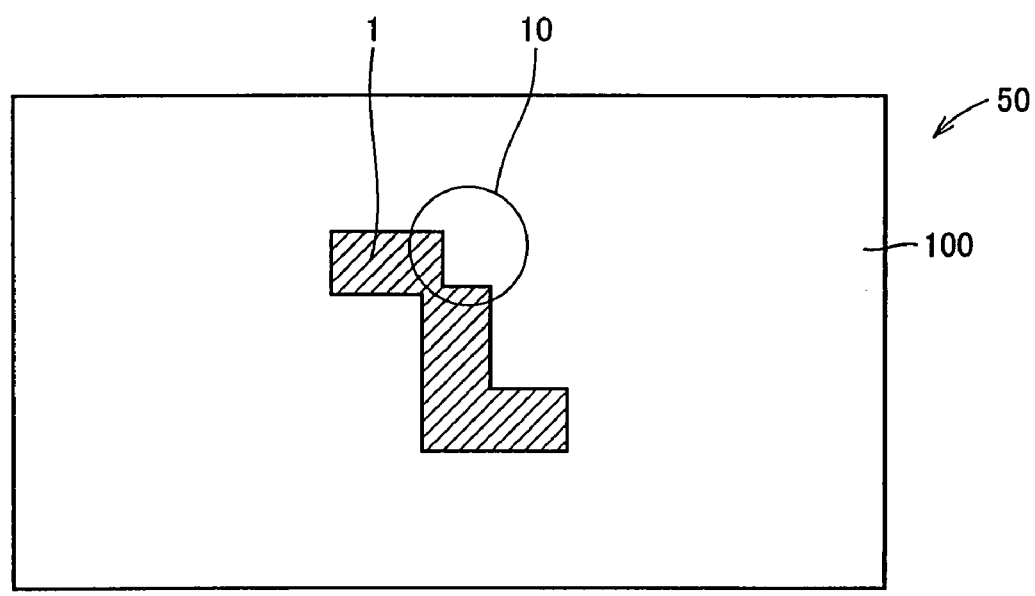
FIG. 10 is a view illustrating an example of a clear defect formed in a photomask.
Figure 11:
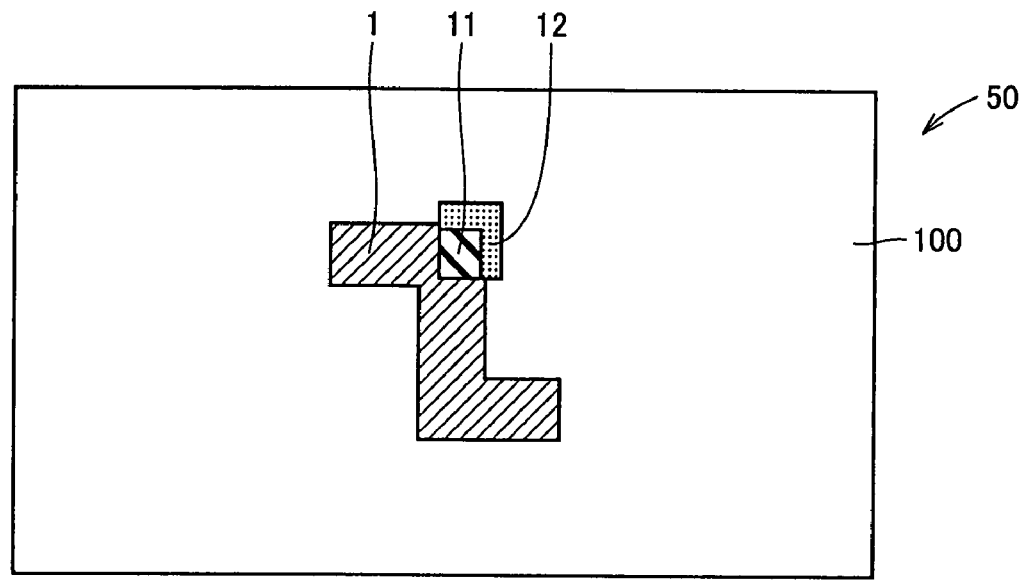
FIG. 11 is a view illustrating the photomask wherein the clear defect illustrated in FIG. 10 is corrected.
Figure 12:
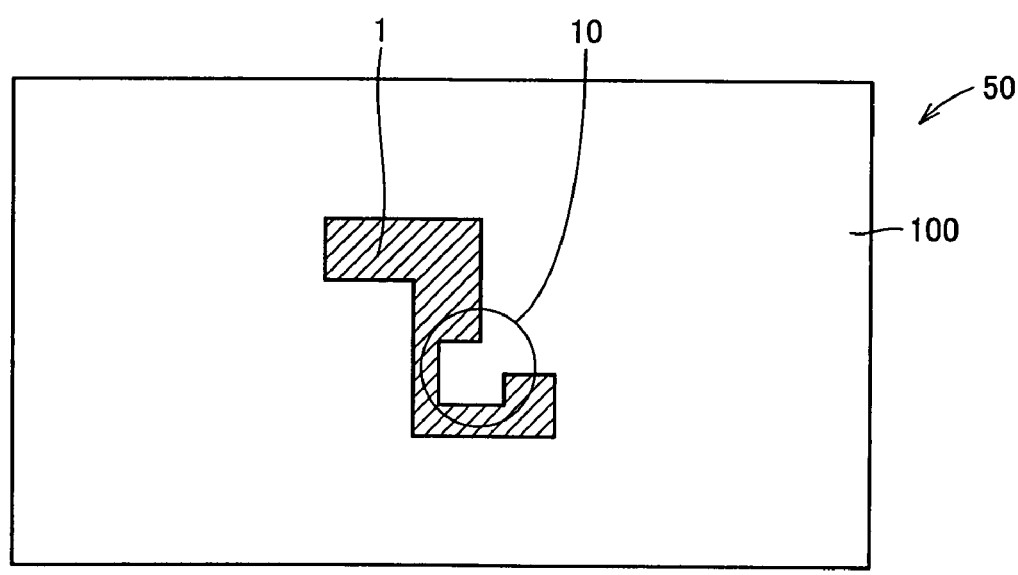
FIG. 12 is a view illustrating an example of a clear defect formed in a photomask.
Figure 13:
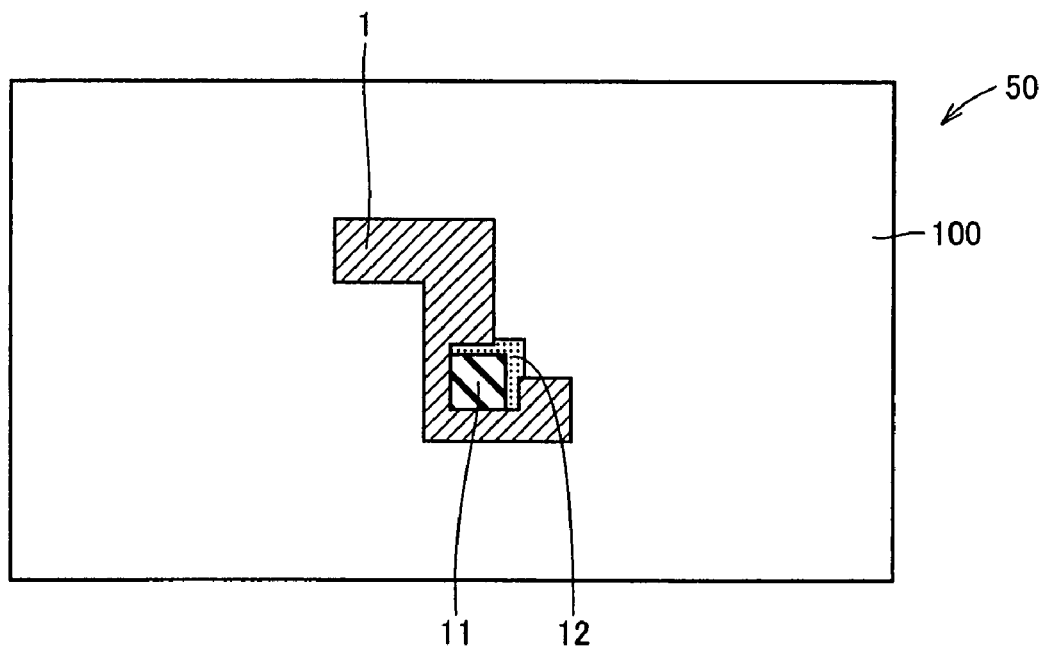
FIG. 13 is a view illustrating the photomask wherein the clear defect illustrated in FIG. 12 is corrected.
Figure 14:
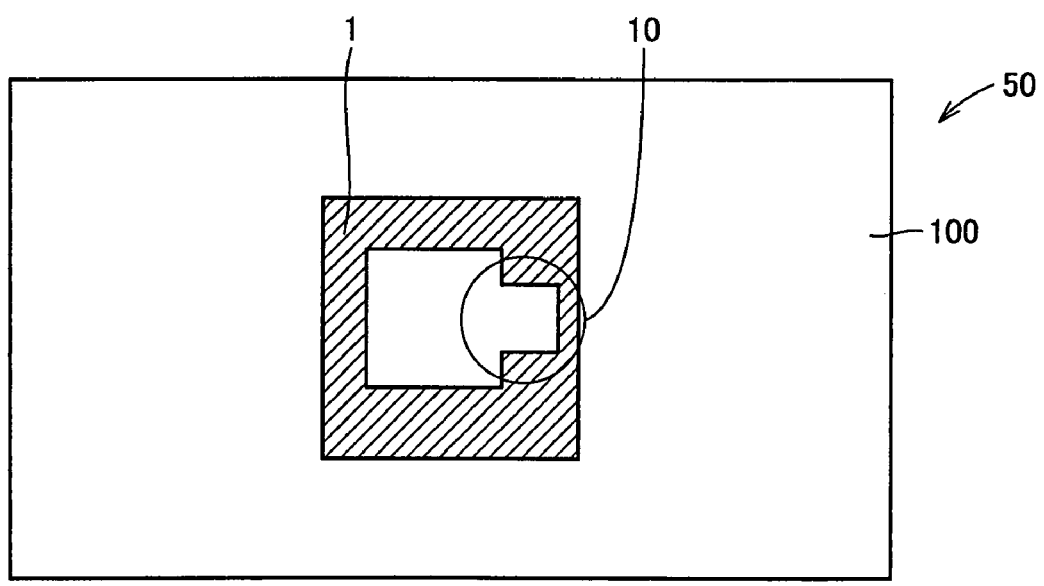
FIG. 14 is a view illustrating an example of a clear defect formed in a photomask.
Figure 15:
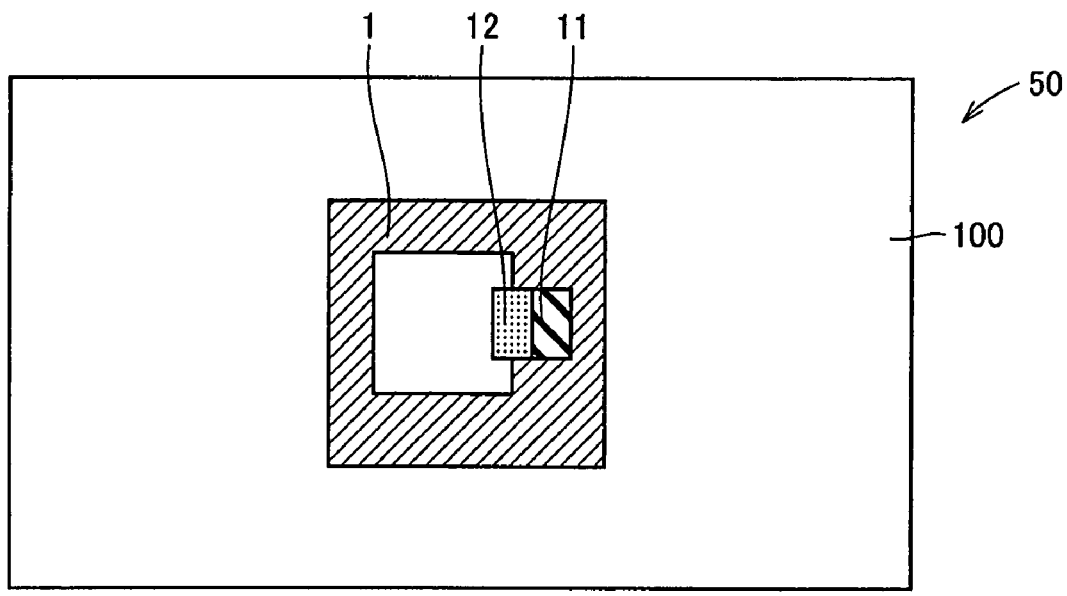
FIG. 15 is a view illustrating the photomask wherein the clear defect illustrated in FIG. 14 is corrected.
Figure 16:
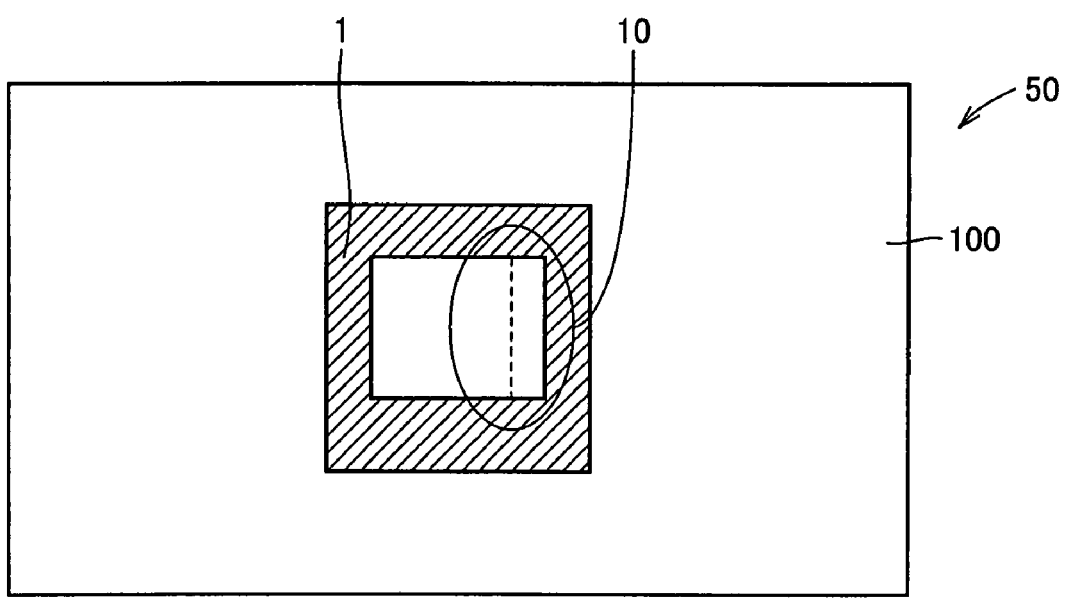
FIG. 16 is a view illustrating an example of a clear defect formed in a photomask.
Figure 17:
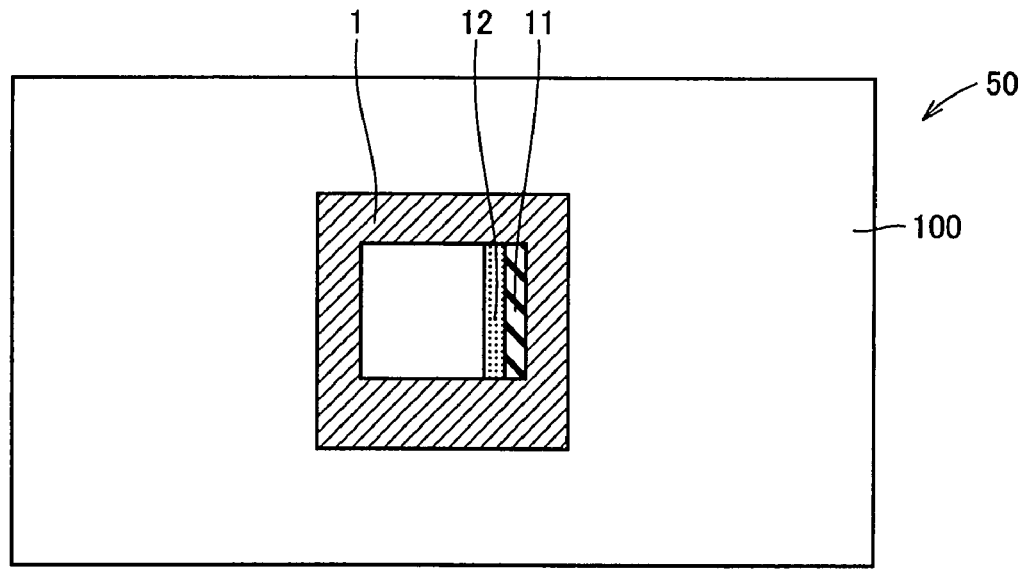
FIG. 17 is a view illustrating the photomask wherein the clear defect illustrated in FIG. 16 is corrected.
Figure 18:
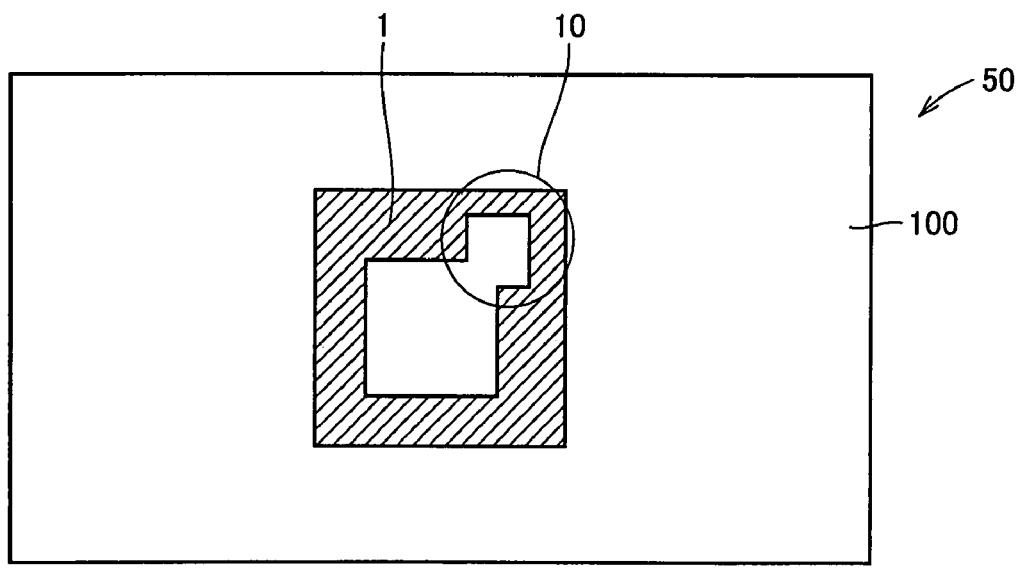
FIG. 18 is a view illustrating an example of a clear defect formed in a photomask.
Figure 19:
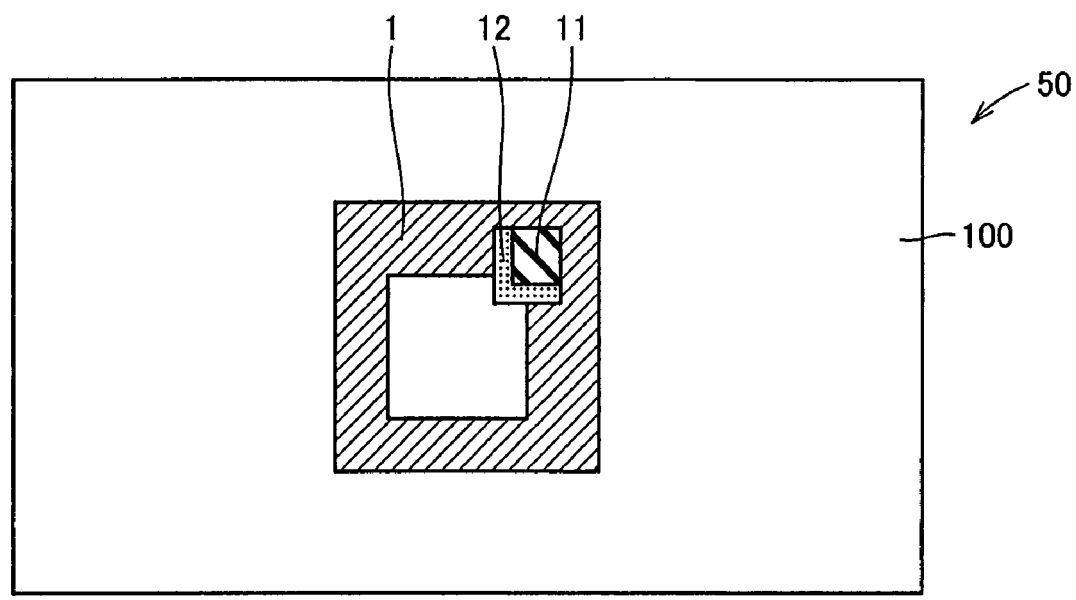
FIG. 19 is a view illustrating the photomask wherein the clear defect illustrated in FIG. 18 is corrected.

For example, an edge missing defect in a wiring pattern, illustrated in FIG. 8, can be corrected by a defect correction portion as illustrated in FIG. 9. A corner missing defect as illustrated in each of FIGS. 10, 12 and 18 can be corrected by a defect correction portion as illustrated in each of FIGS. 11, 13 and 19. An edge missing defect in a contact hole pattern illustrated in FIG. 20 can be corrected by a defect correction portion as illustrated in FIG. 21. An edge retreating defect illustrated in each of FIGS. 14 and 16 can be corrected by a defect correction portion as illustrated in each of FIGS. 15 and 17. Patterns 1 (semitransparent film) on a photomask, shading area 11 and semitransparent areas 12 in the embodiments illustrated in FIGS. 8 to 21 are the same as illustrated in FIG. 1 except their locations, dimensions and shapes.

The forms of the correction portions illustrated in FIGS. 8 to 21 are mere examples, and the working accuracy of the correction portions can be optimized dependently on the shape, location and size of actual defects.

Figure 22:
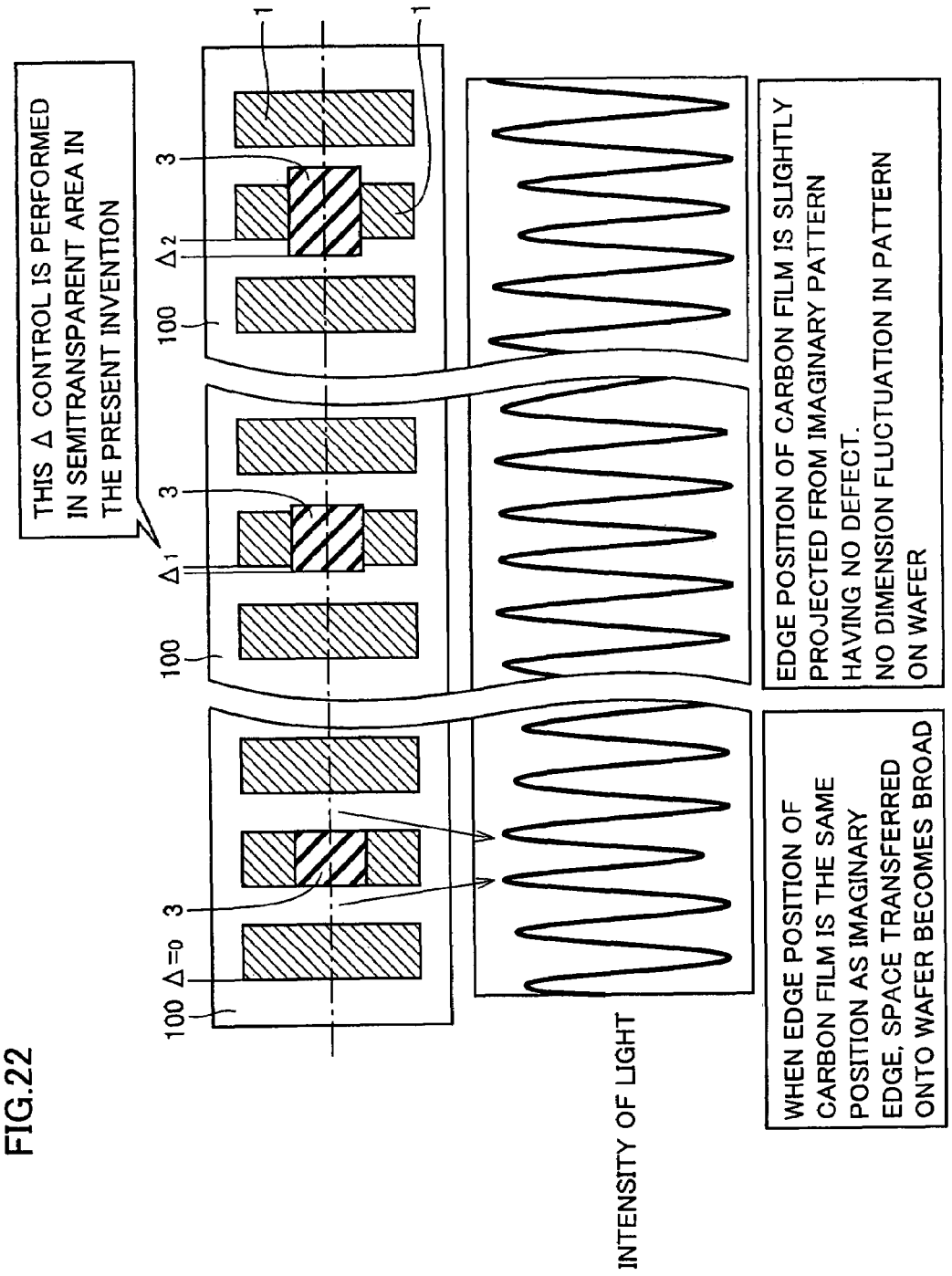
FIG. 22 is a view showing a relationship between the width of a semitransparent area formed in the correction portion in the case of correcting the clear defect in the wiring pattern of the HT mask according to the comparative embodiment and the intensity of light transmitted through the photomask.

Referring to FIG. 22, the following will describe the reason why when a clear defect in an HT mask is corrected by the clear defect correcting method according to the present embodiment as described above, the correction working margin can be improved. In the clear defect correcting method according to the comparative embodiment, carbon film 3 having a transmissivity of about 0% is formed on the clear defect portion. However, carbon film 3 does not produce the phase effect on its pattern edge. Therefore, when carbon film 3 having the same shape as the imaginary pattern having no clear defect is formed as illustrated on the left side in FIG. 22, the width of the wiring pattern on the wafer (corresponding to wiring pattern 1 made of the semitransparent film on the photomask) gets small because the diffraction light through the edge of carbon film 3 intensifies the intensity of the light through transparent (space) area.

In order to correct an error in the width of the wiring pattern on the wafer, resulting from the diffracted light from the edge of carbon film, it is necessary in the clear defect correcting method according to the comparative embodiment to shift the edge location of carbon film 3 from the edge of the imaginary pattern as illustrated at the center and on the right side in FIG. 22 so as to set the dimension of the pattern, on the wafer, corresponding to the correction portion of the clear defect to a target dimension. Therefore, in the clear defect correcting method according to the comparative embodiment, the correction offset $\Delta_1$ ($\Delta_2$) is adjusted. That is, the dimension of the pattern on the wafer corresponding to the correction portion of the clear defect is controlled into the target dimension by setting the edge location of carbon film 3 having a transmissivity of about 0% outside the edge location of the imaginary pattern.

As illustrated in FIG. 4, however, in the clear defect correcting method of the present embodiment, the correction offset location is controlled by the edge location of semitransparent areas 12 adjacent to shading area 11 having a transmissivity of about 0%.

In general, the dimension of a pattern on a wafer, resulting from the transfer of a clear defect corrected portion of a photomask, fluctuates by balance between the intensity of light transmitted through a transparent area of a transparent substrate of the photomask and the intensity of light transmitted through a shading area thereof. This fact will de described referring to FIG. 22.

It can be understood from FIG. 22 that in the correction by left carbon film 3 having a correction offset $\Delta$ of 0, the intensity of light transmitted through a correction portion of the photomask gets larger than the intensity of light transmitted through the other portions of the photomask. It can also be understood from FIG. 22 that in the correction by right carbon film 3 having a correction offset $\Delta$ of $\Delta_2$, the intensity of light transmitted through a correction portion of the photomask gets smaller than the intensity of light transmitted through the other portions of the photomask. It can also be understood from FIG. 22 that in the correction by central carbon film 3 having a correction offset $\Delta$ of $\Delta_1$, the intensity of light transmitted through a correction portion of the photomask is equal to the intensity of light transmitted through the other portions of the photomask.

Therefore, in the case that the intensity of light is adjusted by the edge location of semitransparent areas 12 where the light intensity fluctuates gently as in the clear defect correcting method of the present embodiment, the tolerable range of errors in the edge location of a correction portion gets larger than in the case that the intensity of light is adjusted by the edge location of carbon film 3 having a transmissivity of about 0% where the light intensity fluctuates abruptly. Consequently, in the clear defect correction method of the present embodiment, the semitransparent portion is used to correct any clear defect.

Second Embodiment

The following will describe a method for correcting a hole pattern of a photomask according to a second embodiment. In the photomask correcting method of the present embodiment, the same manner as in the photomask correcting method of the first embodiment is used except that a pattern to be corrected is different.

Figure 20:
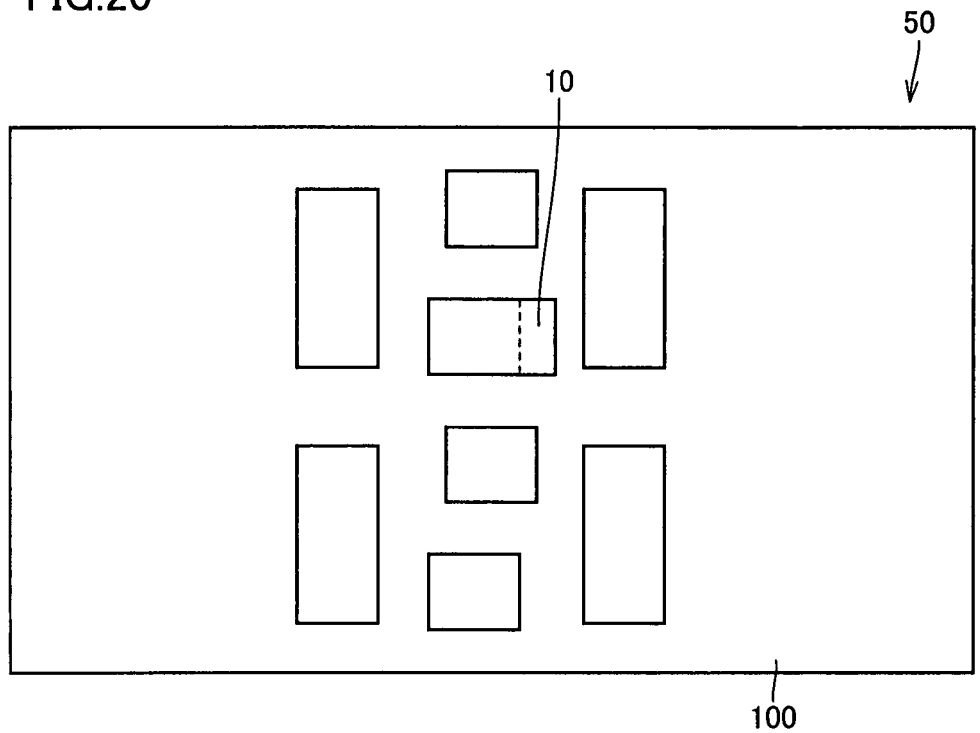
FIG. 20 is a view illustrating a clear defect in a hole pattern formed in a photomask according to a second embodiment.
Figure 21:
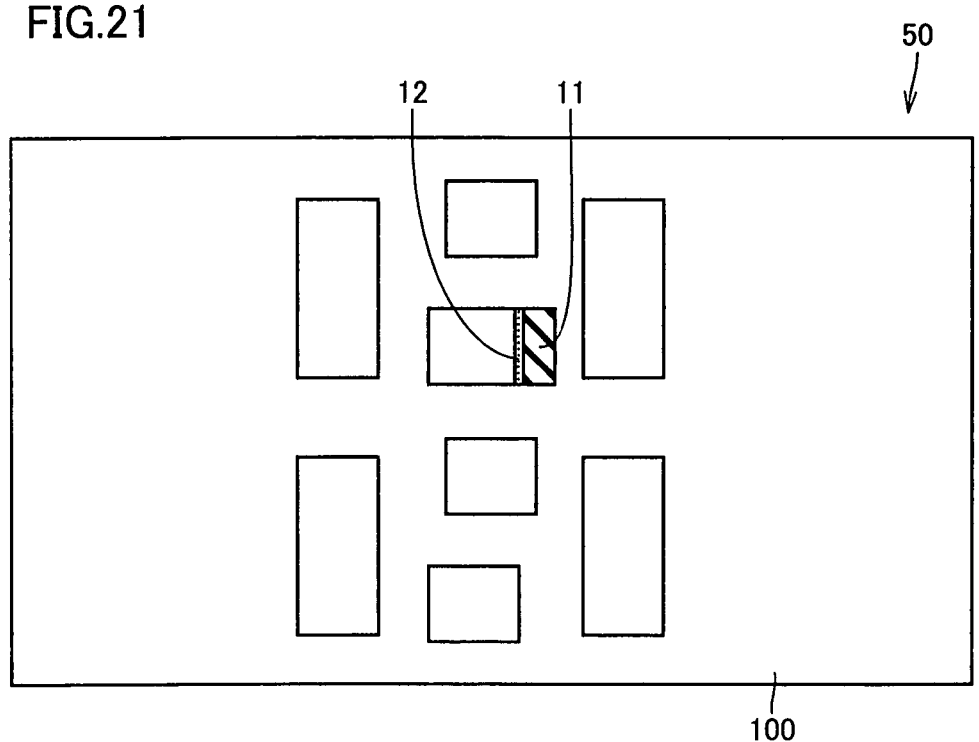
FIG. 21 is a view illustrating the photomask wherein the clear defect illustrated in FIG. 20 is corrected.

FIGS. 20 and 21 illustrate a state that in an HT mask used at an exposure wavelength of 248 nm, a clear defect (edge missing defect having a dimension of about 0.3 µm) is formed at an edge of a hole pattern about 0.6 µm square.

In the method of using a carbon film to correct a clear defect according to the comparative embodiment, in order to make the tolerable range of the dimensional fluctuation of the pattern, on a wafer, obtained after a clear defect corrected portion is transferred, into the range of ±10% of a target dimension, it is necessary that the tolerable location of carbon film 3 formed on the photomask is within the range of ±68 nm (span: 136 nm) from the best location wherein the dimension of pattern transferred on a wafer (corresponds to the corrected portion) becomes the target dimension.

However, when the correcting method according to the present embodiment is used, the following matter can be mentioned.

In the present embodiment, the edge location of a shading area 11 having a transmissivity of about 0% is set to the edge of an imaginary pattern. A semitransparent area 12 having a transmissivity of 15% and a phase difference from a transparent substrate 100 of 0 is formed at the center of a hole. At this time, the tolerable range of the gap of the edge location of semitransparent area 12 is within the range of ±152 nm (span: 304 nm) from the best location. That is, the correcting method according to the present embodiment is used to make it possible to improve the defect correction margin on the photomask.

Figure 23:
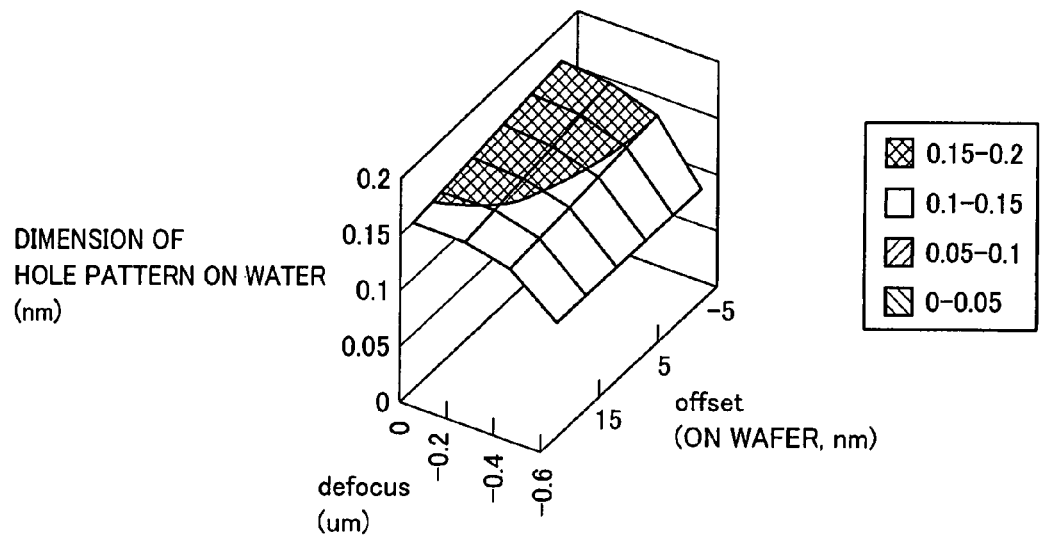
FIG. 23 is a view for describing the correction offset of a clear defect in a hole edge in the comparative embodiment.
Figure 24:
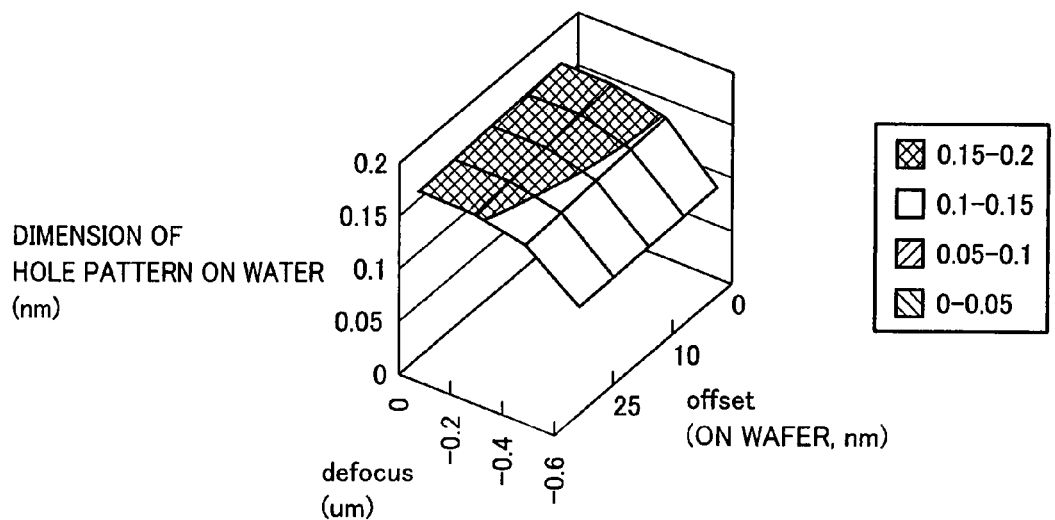
FIG. 24 is a view for describing the correction offset of a clear defect in a hole edge in an embodiment of the present invention.

About dimensional fluctuation of a defect correction portion on the basis of exposure defocusing in a lithographic step, the photomask correcting method according to the present embodiment is compared with the photomask correcting method according to the comparative embodiment. The results are shown in FIGS. 23 and 24. The value of the dimensional fluctuation is estimated, using optical intensity simulation. As illustrated in FIGS. 23 and 24, it is understood that the dimensional fluctuation on the pattern on a wafer at the time of defocusing is smaller in the correcting method according to the present embodiment than in the clear defect correcting method according to the comparative embodiment.

Third Embodiment

The following will describe the photomask correcting method of the first or second embodiment in more detail.

Figure 25:
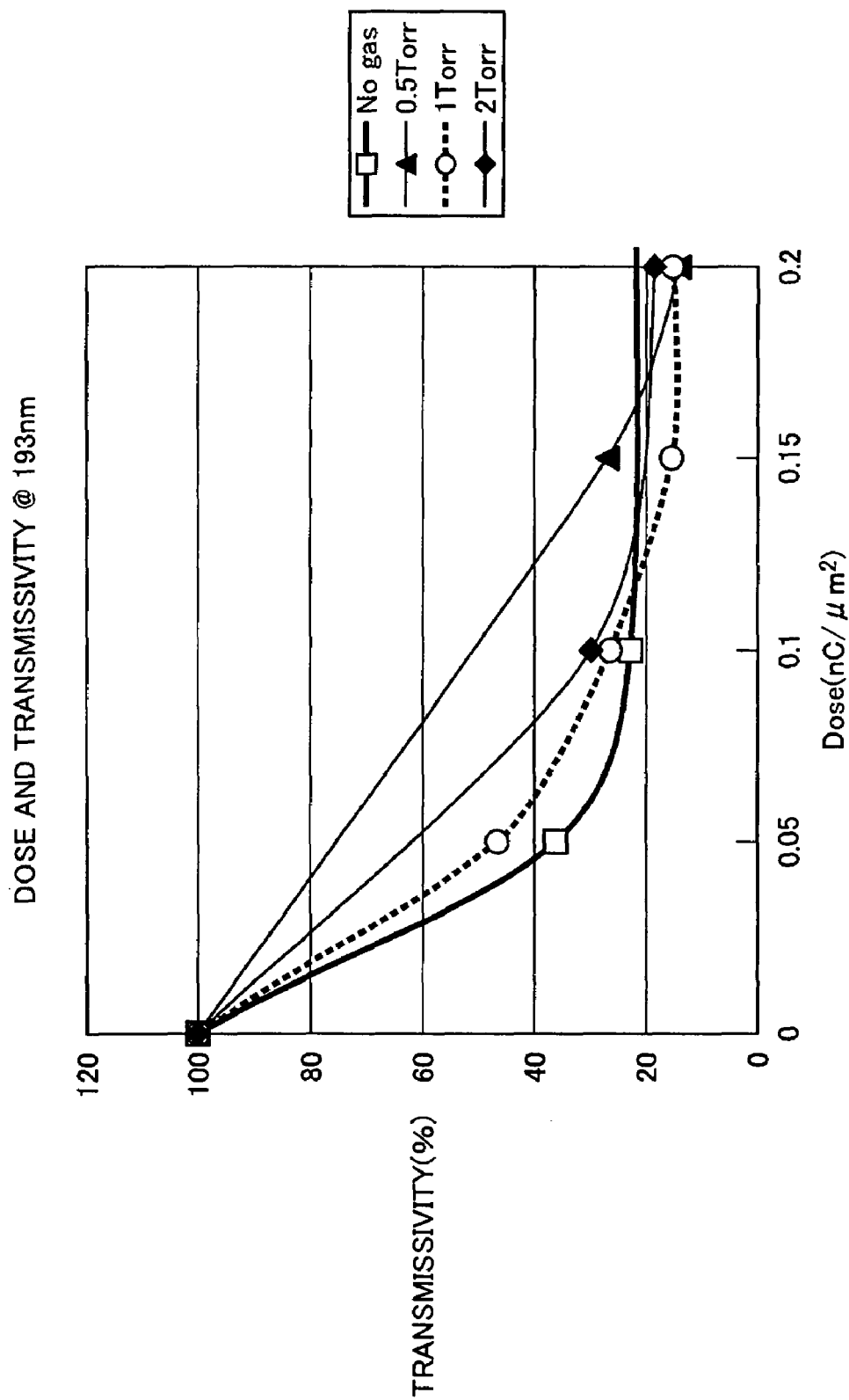
FIG. 25 is a graph showing a relationship between the transmissivity of a transparent substrate and the dose of ions implanted into the transparent substrate.

FIG. 25 shows results measured in the case that Ga ions are radiated onto the surface of transparent substrate 100 made of quartz as a mask material by means of an FIB radiating apparatus wherein the accelerating voltage thereof is 30 KeV, and shows change in the light transmissivity of a portion onto which Ga ions are radiated when the total dose of the Ga ions is changed. As the radiated ions, ions of Au, Si or Be may be used instead of the Ga ions. In, Pb or Zn may be used instead of Ga if the problem of difficulty in the use thereof is overcome.

As illustrated in FIG. 25, the dose of radiated Ga ions is increased from 0 to 0.2 nC/µm$^2$, the transmissivity of transparent substrate 100 is gradually lowered. For example, the transmissivity of the surface of transparent substrate 100 onto which Ga ions are radiated at a dose of 0.1 nC/µm$^2$ is 22% when the wavelength of light is 193 nm. However, the transmissivity does not change very much even if the dose is further increased.

Figure 26:
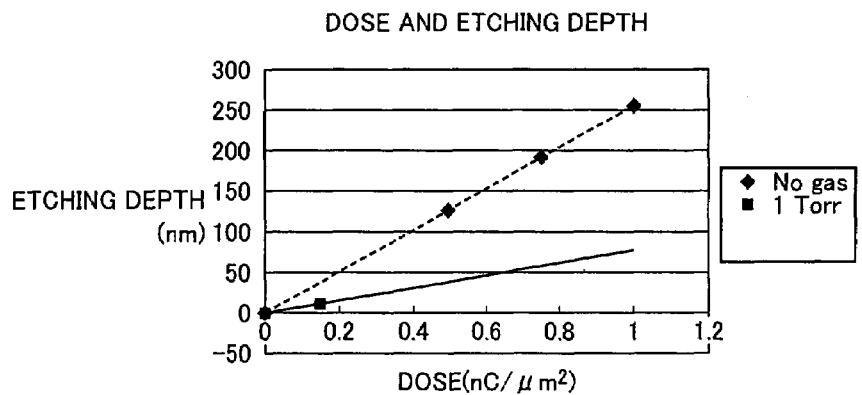
FIG. 26 is a graph for describing a relationship between the dose of a radiated focused ion beam and the etching depth of a transparent substrate made of quartz.

The surface of transparent substrate 100 onto which Ga ions are radiated is etched. FIG. 26 shows experimental data for describing a relationship between the dose of Ga ions by the FIB radiating apparatus and the etching depth of transparent substrate 100 etched by the ions. For example, transparent substrate 100 is etched up to a depth of 128 nm at a dose of 0.5 nC/µm$^2$. Furthermore, the surface of transparent substrate 100 is physically etched (sputtered) when radiated Ga ions collide with the surface of transparent substrate 100, and further a part of the Ga ions is implanted into the vicinity of the surface of transparent substrate 100. As a result, the transmissivity of transparent substrate 100 is lowered by the implanted Ga layer.

When Ga ions are radiated onto transparent substrate 100 in the atmosphere of gas containing $H_2O$, the etching of transparent substrate 100 is hindered by $H_2O$. Therefore, in the state that gas containing $H_2O$ is supplied into the chamber at a pressure of 1 Torr ($\approx$33.32 Pa), Ga ions are radiated at a dose of 0.15 nC/µm$^2$. At this time, the depth of the etched portion of transparent substrate 100 is 12 nm. As illustrated in FIG. 26, however, when Ga ions are radiated onto transparent substrate 100 at a dose of 0.15 nC/µm$^2$ in the atmosphere containing no $H_2O$, transparent substrate 100 is etched by about 38 nm.

When Ga ions are radiated onto transparent substrate 100 in the atmosphere of gas containing $H_2O$, the etching of transparent substrate 100 made of quartz is hindered as described above. Therefore, in the case that Ga ions are radiated onto transparent substrate 100 in the atmosphere of gas containing $H_2O$, a larger amount of Ga ions is implanted into transparent substrate 100 than in the case that Ga ions are radiated onto transparent substrate 100 in the atmosphere of gas containing no $H_2O$. As a result, the transmissivity of the portion onto which Ga ions are radiated can be further lowered.

For example, in the case that Ga ions are radiated onto transparent substrate 100 at a dose of 0.15 nC/µm$^2$ in the state that gas containing $H_2O$ is supplied into the chamber of the FIB radiating apparatus at a pressure of 1 Torr ($\approx$133.2 Pa), the transmissivity of transparent substrate 100 can be lowered to 15%. When the supply pressure of gas containing $H_2O$ and the dose of Ga ions are changed to examine the transmissivity of the portion onto which Ga is radiated, the results are shown in FIG. 25. As illustrated in FIG. 25, about gas containing $H_2O$, the transmissivity of transparent substrate 100 can be made smallest when the supply pressure of the gas is 1 Torr ($\approx$133.2 Pa). When the dose of Ga ions is 0.15 nC/µm$^2$ or more, the transmissivity of transparent substrate 100 is about 15% and constant.

The transmissivity of the Ga ion radiated portion is decided by balance between the initial speed of implanting Ga ions into transparent substrate 100 and the speed of etching transparent substrate 100 by the Ga ions when the dose is from 0.1 to 0.2 µC/µm$^2$. Since the etching of transparent substrate 100 made of quartz by Ga ion radiation is hindered in the atmosphere of gas containing $H_2O$, the speed of implanting Ga ions is larger than the etching speed. As a result, in the case that gas containing $H_2O$ is used, the transmissivity of transparent substrate 100 can be made lower than in the case that gas containing $H_2O$ is not used.

Thereafter, the etching speed and the implanting speed are equilibrated. Therefore, the transmissivity of transparent substrate 100 does not change even if the dose is increased.

In the defect correcting method of the present embodiment, as an example of conditions set to correct a defect portion, the following is used: the condition that the supply pressure of gas containing $H_2O$ is 1 Torr (≈133.2 Pa) and the dose of Ga ions is 0.15 nC/$\mu m^2$. By making the etching amount of transparent substrate 100 minimum under this condition, the defect correction of the HT mask can be more effectively performed.

Figure 27:
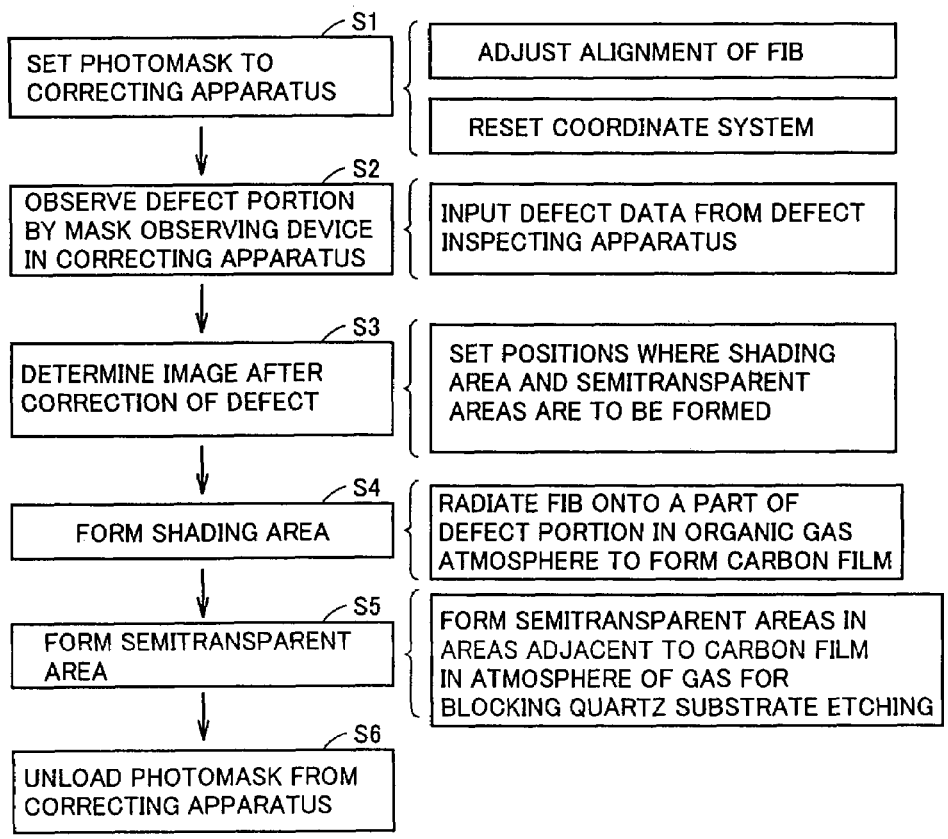
FIG. 27 is a flowchart for describing a clear defect correcting method according to the present invention.

The following will describe an actual example of method for correcting a wire-breaking clear defect in a wiring pattern, the wiring pattern being described as the first embodiment. Operation steps thereof are shown in a flowchart of FIG. 27.

In the defect correction, a photomask wherein a defect is generated is first set in the chamber of an FIB radiating apparatus in step S1. Alignment is performed for matching the location, in the surface of the photomask, onto which FIB is radiated with the defect portion of the photomask. Thereafter, in the state that the photomask is set in the chamber, the coordinate system memorized by a controller of the FIB radiating apparatus is again set. In this way, any location on the photomask can be represented by the coordinates which the controller of the FIB apparatus recognizes. The FIB radiating apparatus will be described later, referring to FIG. 31.

Next, a mask observing device set in the FIB radiating apparatus is used to check the location, shape and dimension of the defect portion of the photomask set in the chamber in step S2. In this way, data (the location, shape and dimension) about the defect in the photomask are recognized by the controller of the FIB apparatus, and the defect data are memorized in a memory of the FIB radiating apparatus. Defect data that are beforehand obtained by a defect inspecting apparatus, which is isolated from the FIB apparatus, may be inputted into the defect correcting apparatus.

Thereafter, how to correct the defect portion is determined from the location, shape and dimension of the defect portion in step S3. That is, the location, shape and dimension of shading area 11 and the location, shape and dimension of semitransparent areas 12 are calculated by calculator in the FIB apparatus. The determined results are used to form a carbon film as shading area 11 having a transmissivity of about 0% in step S4. Next, semitransparent areas 12 which are adjacent to shading area 11 and have a transmissivity of about 15% are formed in step S5. Thereafter, the photomask is taken out from the correcting apparatus in step S6.

In this example, shading area 11 having a transmissivity of about 0% is formed by depositing the carbon film by FIB radiation in the atmosphere of organic gas. The edge location of carbon film 3 is set to a slightly inside location of the imaginary edge location having no defect. That is, the correction offset of the shading area 11 is set to a negative value.

Under the above-mentioned conditions, Ga ions are radiated onto the area where the carbon film is formed as shading area 11 and the area having a distance of about 80 nm or less sideways from the edge location of shading area 11 in order to form the semitransparent area 12. At this time, the carbon film is etched by the Ga ion radiation, but is not completely removed by the Ga ion radiation. The film thickness of the carbon film is set in such a manner that the transmissivity of the carbon film will be about 0% after the Ga ion radiation.

The FIB radiating apparatus is used under the above-mentioned conditions to suppress the etching of the surface of transparent substrate 100, thereby making it possible to suppress difference in the phase of transmitted light between the transparent portion of transparent substrate 100 and the etched portion into a minimum value and form semitransparent areas 12 having a transmissivity of about 15% in transparent substrate 100. As described above, the transmissivity of semitransparent areas 12 is a substantially constant value when the ions are radiated onto transparent substrate 100 at a specific dose or more. Therefore, by radiating the ions onto transparent substrate 100 at the specific dose or more, the transmissivity of semitransparent areas 12 formed on transparent substrate 100 is easily controlled.

Fourth Embodiment

The photomask correcting method of the present embodiment is substantially the same as the photomask correcting method of the third embodiment, but is different from the photomask correcting method of the third embodiment in the following matters.

In the photomask correcting method of the third embodiment, carbon film 3 having a transmissivity of about 0% is formed and subsequently Ga ions are radiated onto the area where carbon film 3 is formed and the area near it, thereby forming a structure for correcting a clear defect.

However, in the photomask correcting method of the present embodiment, semitransparent areas 12 are formed by radiating Ga ions onto transparent substrate 100, and subsequently a carbon film is formed as shading area 11. This method also makes it possible to produce the same effects as produced by the photomask correcting method of the third embodiment.

Fifth Embodiment

In the photomask correcting method of the present embodiment, carbon film 3 is first used for a clear defect portion to form shading area 11 having a transmissivity of about 0% in the clear defect portion. Thereafter, the location of transparent substrate 100 where Ga ions are to be implanted is shifted outwards by shifting FIB radiation outside the carbon film. In this way, semitransparent areas 12 are formed outside the carbon film. Accordingly, no Ga ions are implanted in the carbon film. This method also makes it possible to produce the same effects as produced by the photomask correcting method of the third embodiment.

Sixth Embodiment

In the photomask correcting methods of the first to fifth embodiments, the FIB radiating apparatus is used to correct clear defects. However, the photomask correcting method of the present embodiment, a laser CVD apparatus is used instead of the FIB radiating apparatus to form shading area 11 having a transmissivity of about 0%, and subsequently semitransparent areas 12 adjacent to shading area 11 are formed. Each of shading area 11 and semitransparent areas 12 is made of a deposited film (for example, a Cr film). Accordingly, the difference in transmissivity between shading area 11 and semitransparent areas 12 depends on the magnitudes of the film thicknesses of the two films (the film thickness of shading area 11>the film thickness of semitransparent areas 12). This method also makes it possible to make large the working accuracy margin of the correction portion of a clear defect in the mask, the margin being required for setting pattern dimensional fluctuation of the clear defect portion on the wafer within a tolerable range.

Seventh Embodiment

In the photomask correcting methods of Embodiments 1 to 5, semitransparent areas 12 are formed by Ga ion implantation based on FIB radiation. However, according to the photomask correcting method of the present embodiment, in the process of forming shading area 11 having a transmissivity of about 0%, carbon film 3 is formed by radiating an FIB or a laser onto transparent substrate 100 in the atmosphere of organic gas, and subsequently FIB radiation or laser CVD is used to form a film, as semitransparent areas 12, made of a film having a smaller thickness than the thickness of shading area 11. This photomask correcting method also make it possible to produce the same effects as produced by the photomask correcting methods of the first to fifth embodiments.

Eighth Embodiment

In the photomask correcting methods of the first to seventh embodiments, semitransparent areas 12 are formed by implanting Ga ions onto the surface of transparent substrate 100 through FIB radiation or by depositing a film having a small film thickness on the surface through FIB radiation or laser CVD. However, in the photomask correcting method of the present embodiment, FIB milling (etching) is used instead of the FIB radiation in the photomask correcting methods of the first to seventh embodiments. Namely, by etching transparent substrate 100 into which Ga is implanted, the amount of Ga ions implanted in transparent substrate 100 is decreased but the surface of desired areas in transparent substrate 100 can be subtly roughened. In this way, irregular reflection of light is generated on the roughened surface of transparent substrate 100. Thus, the roughened areas become semitransparent areas 12. This photomask correcting method also make it possible to produce the same effects as produced by the photomask correcting method of the first to seventh embodiments.

Ninth Embodiment

In the case that a clear defect in a wiring pattern on an HT mask is corrected in the photomask correcting method of the first embodiment, difference between the phase of light transmitted through transparent substrate 100 and the phase of light transmitted through semitransparent areas 12 (i.e., the phase difference therebetween) is changed. In this case, change in the dimensional fluctuation coefficient of the pattern transferred on a wafer is obtained by optical intensity simulation. The results are shown in FIG. 7.

FIG. 7 demonstrates that the margin of working accuracy, which is the tolerable range of the edge location of semitransparent areas 12 formed in the clear defect portion of the photomask, is smallest when the phase difference is 180° and is largest when the phase difference is 0%. Therefore, in order to use the effect of the photomask correcting method of the first embodiment as much as possible, it is necessary to make the difference between the phase of light transmitted through semitransparent areas 12 formed on the correction portion of any clear defect and the phase of light transmitted through the transparent portion of the transparent substrate close to 0° as much as possible.

For this purpose, in the photomask correcting methods of the first to fifth and eighth embodiments, FIB radiation conditions are set in such a manner that the depth of the semitransparent portion etched by FIB radiation is close to a value even-numbered times larger than $d=\lambda/2(n-1)$ wherein $\lambda$ represents the exposure wavelength and n is the refractive index of the transparent substrate to light.

Tenth Embodiment

Figure 28:
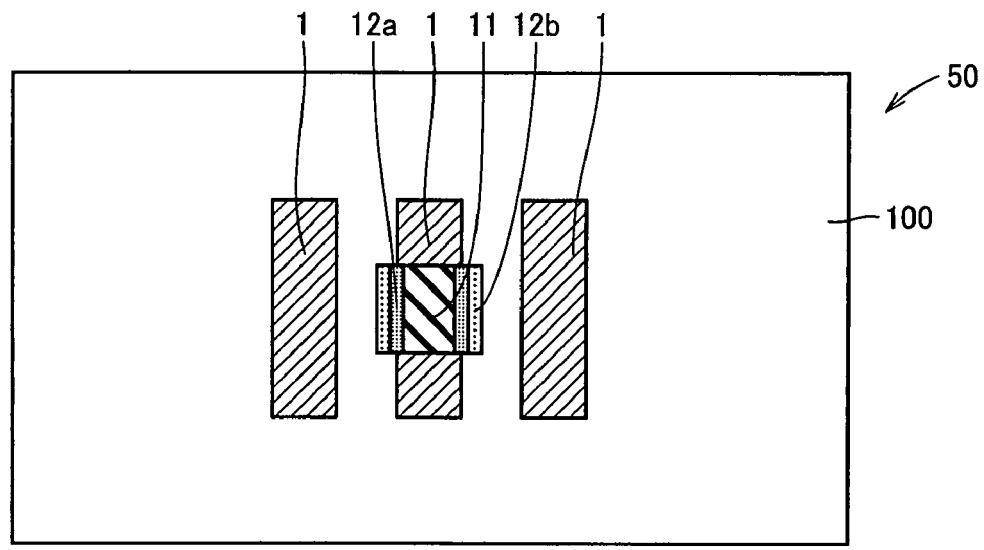
FIG. 28 is a view for describing that a semitransparent area in the photomask correcting method according to a tenth embodiment has two kinds of transmissivities.

In the photomask correcting methods of the first to ninth embodiments, in the clear defect correction portion of the photomask, semitransparent areas 12 adjacent to shading area 11 having a transmissivity of about 0% are made of areas having one kind of transmissivity. However, in the photomask correcting method of the present embodiment, each of semitransparent areas 12 is made of plural kinds of areas having different transmissivities, as illustrated in FIG. 28. This method also make it possible to improve the margin of working accuracy of the correction portion of a defect in the same manner as the photomask correcting methods of the first to ninth embodiments.

Eleventh Embodiment

In the methods for correcting a clear defect in a mask of the first to tenth embodiments, the transmissivity of shading area 11 is about 0%. However, in the photomask correcting method of the present embodiment, shading area 11 has a transmissivity of several percentages. The terms "a transmissivity of several percentages" means that the transmissivity is from 2 to 6%.

In the case that shading area 11 has a transmissivity of several percentages as described above, the margin of working accuracy of the correction portion of a clear defect in the photomask can be improved in the same manner as in the photomask correcting methods of the first to tenth embodiments by making the width of semitransparent areas 12 formed adjacently to shading area 11 larger than in the case that shading area 11 having a transmissivity of about 0% is formed.

Twelfth Embodiment

In the photomask correcting methods of the first to eleventh embodiments, the correction of a clear defect in an HT mask has been described. However, each of the photomask correcting methods of the first to eleventh embodiments can also be applied to a clear defect made on an ordinary mask (the transmissivity of its shading film to a given light wavelength being about 0%), which is not any HT mask. In this way, the same effects as obtained by the photomask correcting methods of the first to eleventh embodiments can be obtained.

Thirteenth Embodiment

Figure 29:
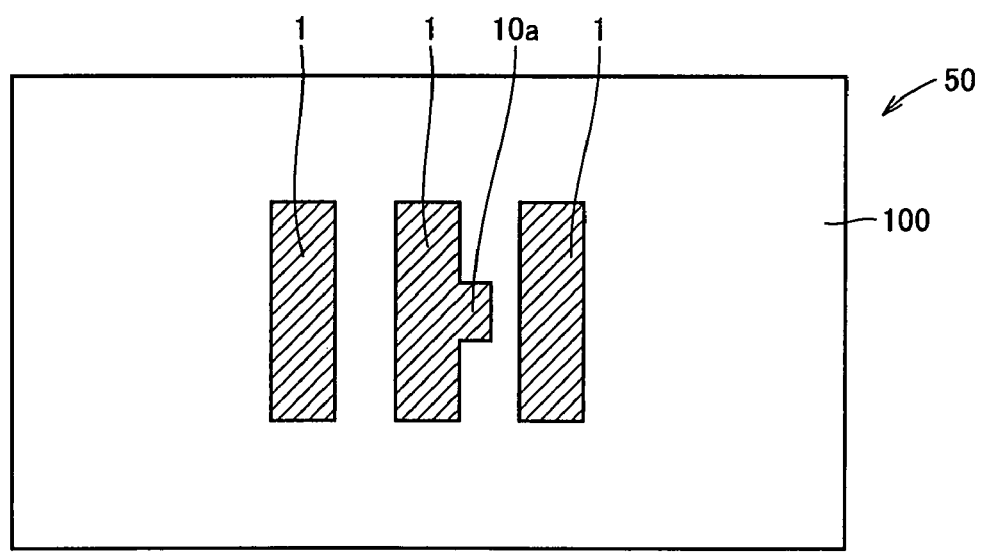
FIG. 29 is a view for describing an example of an opaque defect corrected by the photomask correcting method according to a thirteenth embodiment.
Figure 30:
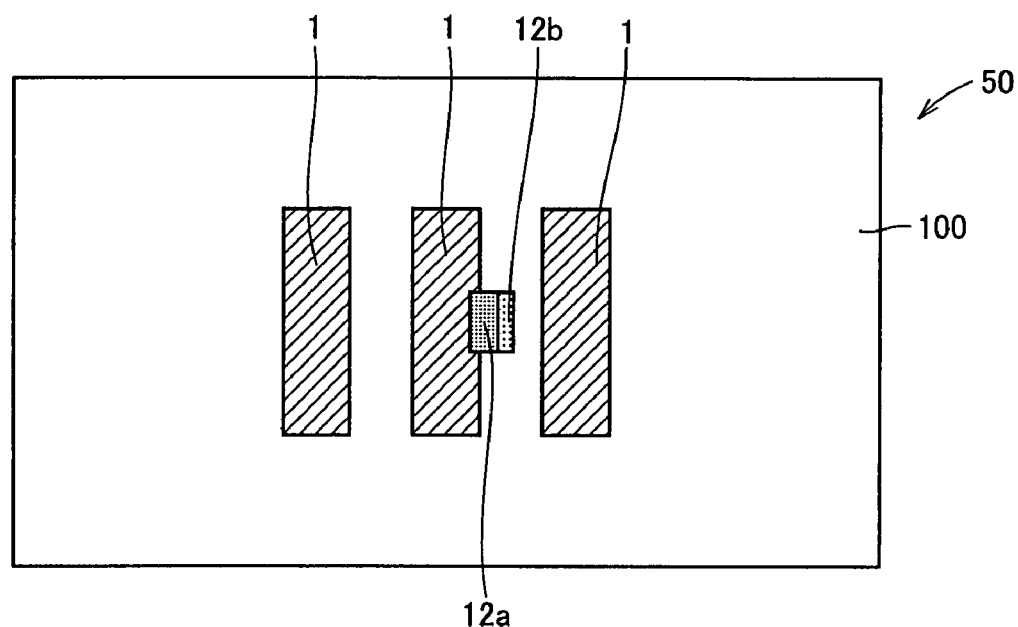
FIG. 30 is a view for describing the opaque defect corrected by the correcting method according to the thirteenth embodiment.

In the photomask correcting methods of the first to twelfth embodiments, clear defect correcting methods have been described. However, the margin of accuracy of the location, shape and dimension of the correction portion of an opaque defect can be made large by correcting the opaque defect as illustrated in FIGS. 29 and 30. The following will describe an opaque defect correcting method specifically, referring to FIGS. 29 and 30.

In the opaque defect correcting method of the present embodiment, a shading film 1 in an opaque defect portion 10a shown in FIG. 29 is first removed by laser or FIB radiation. At this time, shading area 11 is removed in such a manner that the edge of shading film 1 is made hollow inwards from the location of the imaginary edge formed when it is presumed that opaque defect portion 10a is absent. Furthermore, as illustrated in FIG. 30, a semitransparent area 12a is formed in the area where opaque defect portion 10a is removed. As the method of forming semitransparent area 12a, the same forming method as described in each of the first to twelfth embodiments can be used. However, in the correction of the opaque defect, there arises a problem that the transmissivity of a transparent area 12 (i.e., an area including areas 12a and 12b) of the transparent substrate, wherein shading film 1 is removed, is lowered.

However, in the opaque defect correcting method of the present embodiment, at the time of removing excessive shading layer 1 in opaque defect portion 10a, a drop in the transmissivity of portion 12 where opaque portion 10a is removed is corrected by making the location of the edge of the pattern formed after the removal of opaque defect portion 10a hollow inwards from the imaginary edge formed when it is assumed that opaque defect portion 10a is absent.

Furthermore, the opaque defect correcting method of the present embodiment, semitransparent area 12a is formed. The formation of semitransparent areas 12a in this way makes it possible to control the dimensional fluctuation of the pattern transferred on a wafer minutely. As a result, in the opaque defect correcting method of the present embodiment, the margin of working accuracy of the portion where a defect is to be corrected can be made large, as well.

Fourteenth Embodiment

Figure 31:
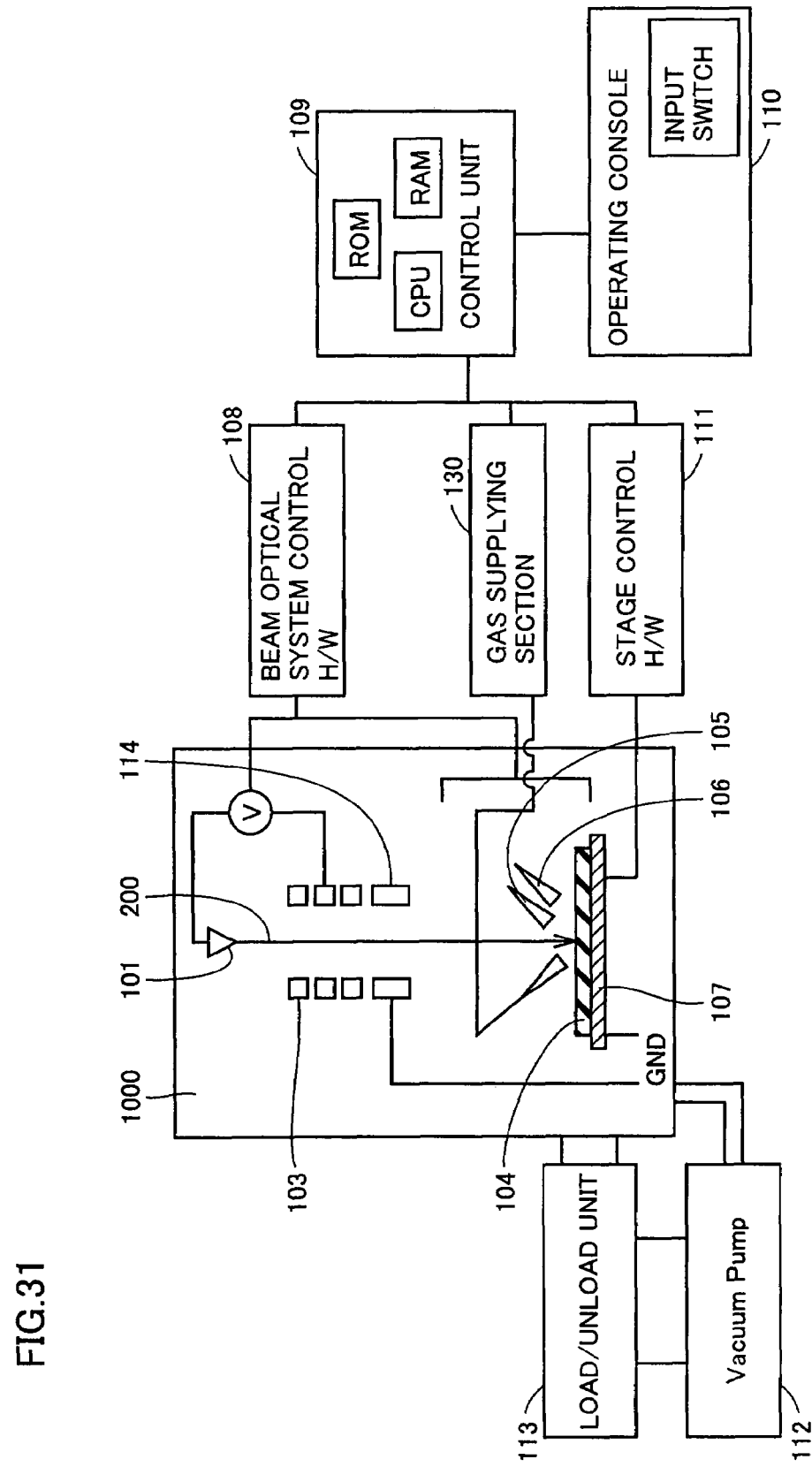
FIG. 31 is a view for describing a defect correcting apparatus according to a fourteenth embodiment.

The following will describe a defect correcting apparatus capable of carrying out FIB radiation onto a photomask, the apparatus being used in the photomask defect correcting methods in the first to fifth and seventh to thirteenth embodiments, referring to FIG. 31.

The defect correcting apparatus of the present embodiment, using FIB radiation, has a structure illustrated as in FIG. 31. The defect correcting method using this defect correcting apparatus is as follows.

A mask substrate 104 used as a photomask is set onto a mask stage 107 inside a load/unload unit 113. The inside of a beam chamber 1000 is made into a vacuum state by a vacuum pump 112. After mask substrate 104 is mounted on mask stage 107, vacuum pump 112 is used to make the inside of load/unload unit 113 into a vacuum state. Thereafter, a valve (not illustrated) between load/unload unit 113 and beam chamber 1000 is opened, and mask stage 107 is moved into beam chamber 1000.

An ion source 101 fixed to the upper portion of beam chamber 1000 is controlled by signals transmitted from a beam optical system control H/W 108, and is heated by a heater, and a high voltage V is applied thereto. As a result thereof, an ion beam 200 is generated from ion source 101. When an operator operates an input switch fitted to an operating console 110, beam optical system control H/W 108 is controlled to drive a magnetic lens 103, thereby adjusting the shape of ion beam 200.

In general, the shape of ion beam 200 produces a large effect on the working accuracy of the correction portion of a defect. Therefore, the shape of ion beam 200 is adjusted into an optimal state for correcting the defect as much as possible within the scope of the capability of the defect correcting apparatus.

By operating the input switch of operating console 110, a stage control H/W 111 is driven. Data on the defect (the location coordinates, shape and dimension thereof) detected by a defect inspecting apparatus (not illustrated) for detecting defects of a photomask are transmitted to a RAM (random access memory) of a control unit 109 on line. Thereafter, on the basis of the data on the coordinates of the defect read out from the RAM of control unit 109, stage control H/W 111 transmits, to mask stage 107, a signal for moving mask stage 107 to a location where ion beam 200 can be radiated into the defect portion of mask substrate 104.

A detector 105 is a member which recognizes an image of a pattern, for example, wiring pattern 1, as a semitransparent film, formed on the photomask, thereby specifying the location, shape and dimension of the pattern. The defect correcting apparatus of the present embodiment is made to make it possible to transmit data on the coordinates of the defect portion and other data from detector 105 to the RAM in control unit 109. According to the present defect correcting apparatus, ion beam 200 or an electron beam is radiated onto mask substrate 104 so that secondary electrons or secondary ions emitted from mask substrate 104 are detected by detector 105. In this way, detector 105 obtains data for specifying the shape, location and dimension of the defect portion.

A CPU (central processing unit) in control unit 109 uses a control program stored in a ROM (read only memory) to specify the area onto which ion beam 200 is to be radiated on the basis of electronic data on the shape, location and size of the defect, the data being stored in the RAM, whereby the CPU transmits data for indicating radiation conditions of ion beam 200 for correcting the defect portion of wiring pattern 1 as the semitransparent film to beam optical system control H/W 108.

Beam optical system control H/W 108 controls the state of ion beam 200 (emission direction of the beam, and so on) from ion source 101 on the basis of the data for indicating the radiation conditions of ion beam 200, the data being transmitted from control unit 109.

The present defect correcting apparatus recognizes the shape, location and dimension of the defect, thereby automatically deciding a final shape of wiring pattern 1, as the semitransparent film, and so on after being corrected. For this purpose, the input switch of operating console 110 is operated, thereby inputting beam radiation conditions such as beam current, beam radiation pixels, dwell time, and so on. A gas supplying mechanism 130 blows gas (for example, carbon-based gas) for forming a deposition film on the defect portion. Ion beam 200 is radiated from above this gas. As a result, a carbon film as shading area 11 having a transmissivity of about 0% is deposited in the area onto which ion beam 200 is radiated.

After carbon film 3 is formed, gas inside chamber 1000 is discharged. Next, control unit 109 carries out a control for radiating ion beam 200 onto transparent substrate 100 in the vicinity of carbon film 3 in order to form semitransparent areas 12. Thereafter, the pattern of the photomask where the defect is corrected is observed in the same way as used to observe the pattern of the photomask before the defect is corrected, thereby checking whether the correction of the defect portion is appropriately performed or not.

A neutralizer 106 set above mask substrate 104 is a member for radiating, onto mask substrate 104 electrified positively or negatively, electrically reverse charges to suppress the electricity of mask substrate 104.

A blanker 114 positioned under electromagnetic lens 103 is a member for causing ion beam 200 emitted from ion source 101 to flow to a ground electrode (GND) when ion beam 200 does not need to be radiated onto mask substrate 104.

Fifteenth Embodiment

Figure 32:
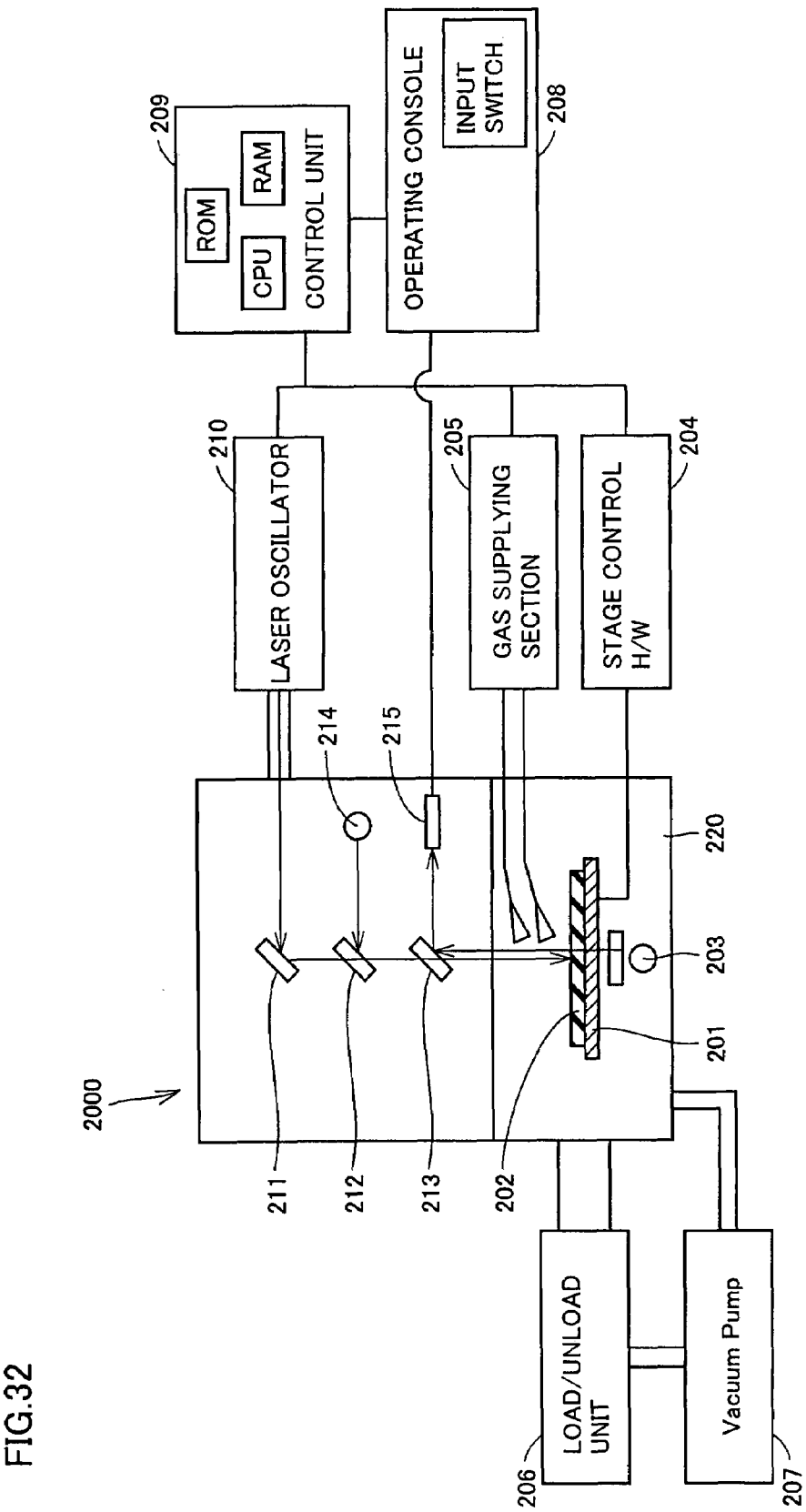
FIG. 32 is a view for describing a defect correcting apparatus according to a fifteenth embodiment.

The following will describe a defect correcting apparatus used in the photomask defect correcting method described in the sixth embodiment, referring to FIG. 32.

The defect correcting apparatus of the present embodiment, using laser CVD, has a structure as illustrated in FIG. 32. The defect correcting method using the defect correcting apparatus 2000 is as follows.

A mask substrate 202, which will be a photomask, is set on a mask stage 201 inside a load/unload unit 206. The inside of a chamber 220 is made into a vacuum state by a vacuum pump 207. After mask substrate 202 is mounted on mask stage 201, vacuum pump 207 is used to make the inside of load/unload unit 206 into a vacuum state.

Thereafter, a valve (not illustrated) between load/unload unit 206 and chamber 220 is opened, and mask stage 201 is moved into chamber 220. Next, a given signal is inputted into a control unit 209 by operating an operating console 208. On the basis of the given signal, a CPU in control unit 209 transmits a specific signal for controlling a gas supplying section 205 to the gas supplying section. The specific signal causes gas supplying section 205 to be driven so as to supply a gas optimal for a film to be deposited on a defect portion of mask substrate 202 inside chamber 220. In the present embodiment, $(Cr(CO_2)_4+N_2)$ gas is used to deposit a Cr film used as a shading film.

A laser oscillator 210 is controlled on the basis of signals transmitted from the CPU in control unit 209, so as to emit a laser ray. The laser ray arrives, through a mirror 211 and half mirrors 212 and 213 fixed to the upper portion of chamber 220, at mask substrate 202.

By operating an input switch of operating console 208, control unit 209 reads, from a RAM in which the coordinates of a defect formed in mask substrate 202 are memorized, data on the coordinates of the defect. Moreover, control unit 209 transmits a signal for moving the location of mask stage 201 to a stage control H/W 204 so that the laser ray can be radiated to the defect portion of mask substrate 202 on the basis of the data on the coordinates of the defect. On the basis of the signals, stage control H/W 204 carries out a control for changing the location of mask stage 201.

A light source 203 is set under mask stage 201, and a light source 214 is set over a microscope 215. Light emitted from light source 203 is transmitted through a transparent substrate 100 in areas other than the areas where wiring patterns 1 as a shading (semitransparent) film are formed on mask substrate 202. The transmitted light is reflected on half mirror 213 and radiated into microscope 215. The light emitted from light source 214 is reflected on half mirror 212 and then reaches mask substrate 202. The light reaching mask substrate 202 is reflected on wiring patterns 1 as the shading (semitransparent) film, and is transmitted through the transparent substrate in areas other than the area where the shading (semitransparent) pattern is formed. The light reflected on the shading film is reflected on half mirror 213 and then radiated into microscope 215.

The light radiated into microscope 215 gives data on an image of the pattern of the shading film on mask substrate 202. Data on an image of the pattern of the shading (semitransparent) film are transmitted as electronic data from microscope 215 to operating console 208, whereby operating console 208 causes the data on the location, shape and dimension of the defect formed in wiring patterns 1 to be memorized in the RAM of the control unit on the basis of the image of wiring patterns 1 as the shadowing (semitransparent) film.

The CPU in control unit 209 uses a program memorized in the ROM to refer to the data on the location, shape and dimension of the defect memorized in the RAM, thereby deciding the pressure in gas supplied from gas supply section 205 into chamber 220, and emission conditions of a laser ray emitted from laser oscillator 210 (laser radiation time, a laser radiation location, and so on). Thereafter, the CPU transmits signals to laser oscillator 210 for controlling laser oscillator 210 so that a laser ray will be emitted from laser oscillator 210 under the decided laser radiation conditions. In this way, the laser is radiated onto the defect portion of wiring patterns 1 on mask substrate 202. As a result, a shading film made of Cr having a transmissivity of about 0% is deposited onto the area where the laser ray is radiated.

Thereafter, stage control H/W 204 carries out a control for moving mask stage 210 on the basis of the control program memorized in the ROM in control unit 209 so that a laser ray will be radiated into the vicinity of the location where the shading film made of Cr is deposited. In this state, when laser oscillator 210 emits a laser ray having a smaller output than the laser ray emitted when the shading film is deposited, a deposition film having a smaller film thickness than shading area 11 is formed as semitransparent areas 12 on transparent substrate 100 in the vicinity of the shading film. Accordingly, the defect is corrected. Thereafter, vacuum pump 207 is driven, thereby discharging the gas in chamber 220.

The pattern of the photomask where the defect is corrected is observed in the same way as used to observe the pattern of the photomask before the defect is corrected, thereby checking whether the correction of the defect portion is appropriately made or not.

The following will describe a specific manner of using the defect correcting apparatus in the fourteenth or fifteenth embodiment to correct a clear defect or an opaque defect.

In the case that the defect correcting apparatus of the fourteenth or fifteenth embodiment is used as a defect correcting apparatus for correcting a clear defect in the photomask wherein the semitransparent film or the shading film is formed on transparent substrate 100, described in each of the first to twelfth embodiments, the defect correcting apparatus functions as follow.

Detector 105 in the fourteenth embodiment or microscope 215 in the fifteenth embodiment functions as a detector for detecting the dimension, location and shape of the pattern of the semitransparent film or the first shading film. Operating console 110 and control unit 109 in the fourteenth embodiment or operating console 208 and control unit 209 in the fifteenth embodiment recognize the location, shape and dimension of the pattern having a generated defect, which is detected by the above-mentioned detectors, and compare the recognized pattern with an imaginary pattern, where a pattern which should be originally formed is completely formed to have no defect, thereby setting data optimal for correcting the defect.

Ion source 101 in the fourteenth embodiment or laser oscillator 210 in the fifteenth embodiment functions as a radiation source for radiating an FIB or a laser beam onto the area necessary for correcting the clear defect generated on the pattern and detected by the defect detecting apparatus, which is isolated from the defect correcting apparatus.

Gas supplying section 130 in the fourteenth embodiment or gas supplying section 205 in the fifteenth embodiment functions as a gas supplying mechanism for supplying gas for depositing the second shading film having a transmissivity of about 0% into the clear defect portion.

Operating console 110 and control unit 109 in the fourteenth embodiment or operating console 208 and control unit 209 in the fifteenth embodiment function as a controller for controlling the location of the photomask where the FIB or the laser beam is radiated.

In order to carry out each of the clear defect correcting methods of the first to twelfth embodiments, the controller has, in its ROM, a program for carrying out a control for radiating the FIB or the laser beam onto the transparent substrate so that after the deposition of the second shading film, a semitransparent portion having a larger transmissivity than the second shading film has will be formed in the peripheral portion of the second shading film.

When the defect correcting apparatus is caused to function as above, the correction of the clear defect can be realized.

In the case that the defect correcting apparatus of the fourteenth or fifteenth embodiment is used as a defect correcting apparatus for correcting an opaque defect in the photomask wherein the semitransparent film or the shading film is formed on transparent substrate 100, described in the thirteenth embodiment, the defect correcting apparatus functions as follow.

Detector 105 in the fourteenth embodiment or microscope 215 in the fifteenth embodiment functions as a detector for detecting the dimension, location and shape of the pattern of the semitransparent film. Operating console 110 and control unit 109 in the fourteenth embodiment or operating console 208 and control unit 209 in the fifteenth embodiment recognize the location, shape and dimension of the pattern having a generated defect, which is detected by the above-mentioned detectors, and compare the recognized pattern with an imaginary pattern, where a pattern which should be originally formed is completely formed to have no defect, thereby setting data optimal for correcting the defect.

In the case that an opaque defect portion is generated in the pattern by the setting of the above-mentioned correcting method, ion source 101 in the fourteenth embodiment or laser oscillator 210 in the fifteenth embodiment functions as a radiation source for radiating an FIB or a laser beam onto the area necessary for correcting the opaque defect portion on the basis of the setting.

Operating console 110 and control unit 109 in the fourteenth embodiment or operating console 208 and control unit 209 in the fifteenth embodiment function as a controller for controlling radiation conditions of the FIB or the laser beam radiated onto the photomask.

In order to carry out the opaque clear defect correcting method of the thirteenth embodiment, the controller has, in its ROM, a program for carrying out a control for radiating the FIB or the laser beam onto the transparent substrate so that in the opaque defect or a portion near it where the semitransparent film or the shading film is removed, a semitransparent film or a semitransparent portion having a larger transmissivity than the shading film has will be formed.

When the defect correcting apparatus is caused to function as above, the correction of the opaque defect can be realized.

In the specification, the transmissivity of a shading film or a shading portion ranges from 0 to 6%, a semitransparent film and a semitransparent portion is a film or a portion having a higher transmissivity than the transmissivity (0 to 6%) of the shading film or the shading portion, and a transparent substrate is a substrate having a higher transmissivity than at least the semitransparent film or the semitransparent portion has.

The above-mentioned photomask after being corrected is used to transfer the pattern of the photomask onto a resist film on a wafer by a known exposure technique, whereby a semiconductor device can be produced.

Figure 33:
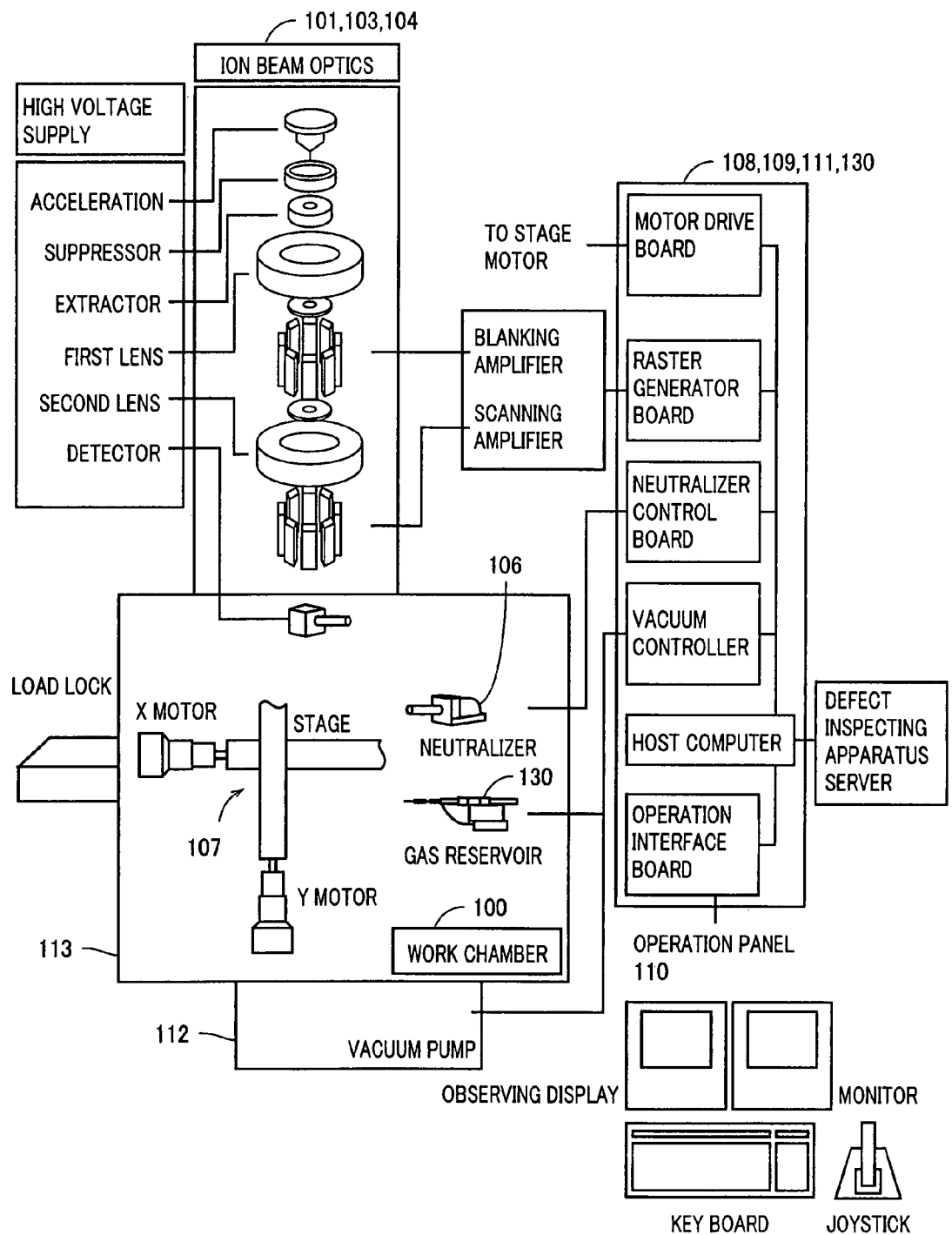
FIG. 33 is a view for describing a specific example of the defect correcting apparatus according to the fourteenth embodiment.

FIG. 33 is a block diagram for describing a specific structure of the photomask correcting apparatus illustrated in FIG. 31. As illustrated in FIG. 33, this photomask correcting apparatus includes an ion beam optics corresponding to ion source 101, magnetic lens 103 and so on illustrated in FIG. 31. This ion beam optics has an acceleration, a suppressor, an extractor, a first lens, a second lens, a gain, a bias, and a detector.

The acceleration is a member for applying a voltage to the suppressor and the extractor to decide a shooting speed of an ion beam. The suppressor is a member for deciding the amount of the beam of $Ga^+$ ions emitted from the tip of the acceleration as ion source 101. The extractor is a member for taking out the ion beam to decide the amount of the ion beam emitted from the ion beam optics. The first and second lenses are members for adjusting the spread of the beam. The bias is a member for applying positive or negative voltage to secondary electrons or secondary ions to hit the secondary electrons or the secondary ions onto the detector. The gain is a member, which is set between the bias and the detector, for accelerating the secondary electrons or the secondary ions. The detector is set inside a work chamber, and is a member for detecting the secondary electrons or the secondary ions which are hit onto a mask substrate 104 and reflected thereon, so as to detect the location, shape and dimension of a defect as image data.

The work chamber corresponding to beam chamber 1000 of the defect correcting apparatus illustrated in FIG. 31 is a chamber, for correcting a defect in mask substrate 104, into which mask substrate 104 is inserted.

Mask substrate 104 is put on stage 107, and introduced into the work chamber. The two-dimensional location of this stage 107 is arbitrarily changed by an X motor or a Y motor. A load lock is set in the work chamber. In order to keep the vacuum degree of the inside of the work chamber, a vacuum pump is set. In the ion beam optics is set a blanking amplifier for pulling out ions emitted in the ion beam optics. In order to radiate the ion beam to a target position, a scanning amplifier for deflecting the ion beam is set up.

Neutralizer 106 is set inside the work chamber. A gas reservoir is also arranged inside the work chamber. This gas reservoir corresponds to gas supplying section 130 of the defect correcting apparatus illustrated in FIG. 31.

As units corresponding to beam optical system control H/W 108, control unit 109 and stage control H/W 111 in FIG. 31, the following are set up: a motor drive board, raster generator board, a neutralizer control board, a vacuum controller, a host computer, and an operation interface board.

The motor drive board is a board connected electrically to the stage, and is for controlling the X motor and the Y motor. The raster generator board is a board for controlling each of the blanking amplifier and the scanning amplifier.

The neutralizer control board is a board for controlling neutralizer 106. The vacuum controller is a controller for controlling the vacuum pump and the gas reservoir. The host computer is connected to a defect detecting apparatus server for detecting a defect formed in a photomask so that they can communicate with each other.

In this defect detecting apparatus server are recorded data on the defect in the photomask detected by the defect detecting apparatus and other data. The operation interface board is connected to an operation panel. This operation panel corresponds to operation console 110.

An observing display, a monitor, a key board, and a joystick are set in the operation panel. In the observing display, an actual image of the defect formed on mask substrate 104 is actually displayed. In the monitor, data on a correcting recipe file, a defect coordinate data file, and so on, which will be detailed later, are displayed. These data can be artificially selected by the operation of the key board or the joystick.

Figure 34:
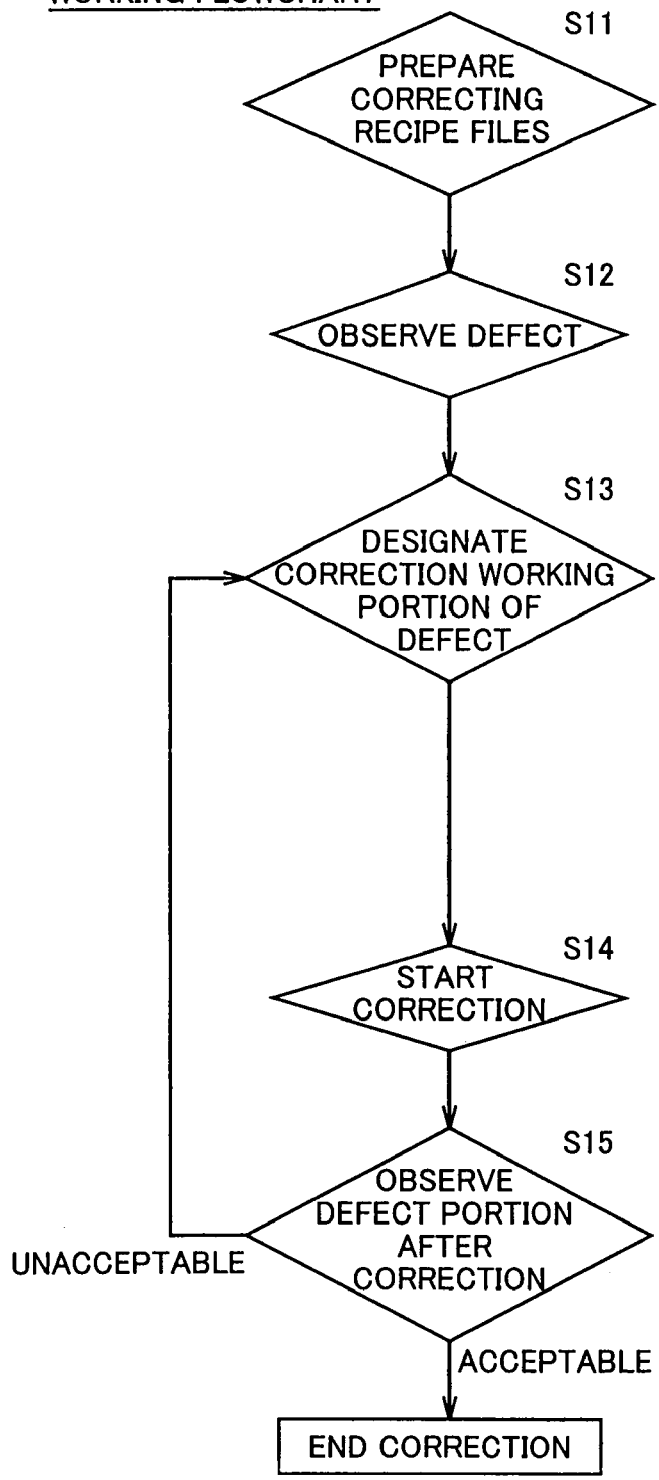
FIG. 34 is a flowchart showing an outline of a defect correcting method using the defect correcting apparatus illustrated in FIG. 33.

The following will describe steps of a defect correcting method performed in the defect correcting apparatus illustrated in FIG. 33, referring to FIG. 34. From data on evaluation of defects and experimental data after correcting the defects, Table 1 is used to decide setting conditions of the defect correcting apparatus at the time of defect correction, which will be detailed later. The data are recorded as correcting recipes in the host computer of the defect correcting apparatus.

In step S11, correcting recipe files are first prepared. Next, the operations in the following steps are performed in accordance with a correction step program in the correcting recipe file.

Next, a defect is observed in step S12. A defect coordinate data file, for example, a defect coordinate file shown in Table 2, which will be detailed later, is read in the host computer from the defect inspecting apparatus, which is set up separately from the defect correcting apparatus. The coordinates of the defect formed in the mask and recorded in this defect coordinate data file are converted to coordinates of the coordinate system of the defect correcting apparatus. The converted coordinates are used to move stage 107 at a position where the defect can be observed. Next, observing conditions are read from the correcting recipe file. Thereafter, on the basis of the observing conditions, parameters of the defect correcting apparatus are automatically decided. Under the above-mentioned observing conditions, an observation image of the defect portion is gained. This observation image is displayed on the monitor.

Next, a correcting work portion of the defect is designated in step S13. In step S13, the defect portion is designated in the observation image on the monitor. For example, the edge location of an HT metal film to be formed when any defect is absent is designated. An operator who operates the apparatus determines the type of the defect (clear defect, opaque defect, edge defect, isolation defect or the like) to select an appropriate correcting recipe file from the beforehand-prepared correcting recipe files. Setting conditions of the defect correcting apparatus, which are specified in the correcting recipe file, are read out.

In this way, parameters for the defect correcting apparatus are automatically set up. For example, in order to correct a wire-breaking clear defect in the wiring pattern, the correcting recipe file prepared for the clear defect is designated. In the correcting recipe file, the following contents are specified: setting conditions of the defect correcting apparatus for forming a deposition film in the shading area, setting conditions of the defect correcting apparatus for forming a semitransparent area, and the working order of the defect correction.

Next, the correction of the defect in the photomask is started in step S14. On the basis of the correcting recipe, conditions for working the correction portion are confirmed. The start of correction on the basis of the working conditions is instructed. In accordance with the working order designated in the correcting recipe, working operation advances under the working conditions designated in the correcting recipe file.

Next, the corrected defect portion is observed in step S15. After the completion of the correction working, for example, the same observing conditions as before the correction are used to gain image data on the correction portion. When it is determined that the shape of the correction working portion is acceptable, the working is ended. When it is determined that the shape of the correction working portion is unacceptable, the present process is returned to step S13, and an observation image of the correction portion is again gained. In this way, it is determined whether the correction of the defect is acceptable or not.

This determination may be performed by the operator using data on the image, or may be performed by the host computer. In the latter case, the host computer determines whether the correction of the defect comes up to a given standard or not. The determination is made by checking the dimension of the shading area and the dimension of the semitransparent area in the correction portion from the observation image and then deciding whether or not the dimension of the shading area and the dimension of the semitransparent area in the correction portion are within respective given dimensions. When it is determined in step 15 that the correction is acceptable, the operation of correcting the defect in the photomask is ended.

Figure 35:
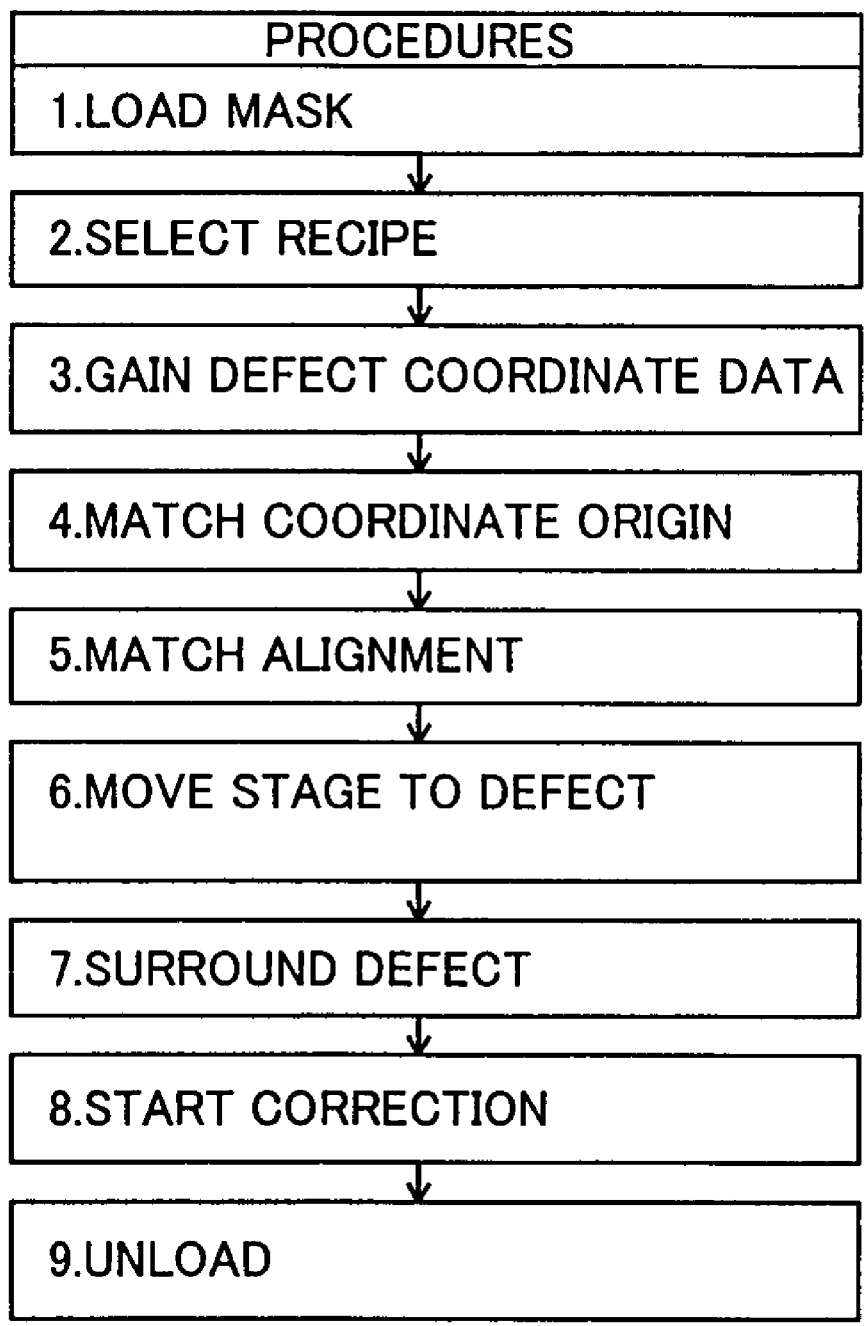
FIG. 35 is a flowchart showing a specific example of the defect correcting method using the defect correcting apparatus illustrated in FIG. 33.

The following will describe a flowchart of specific operations of a mask defect correcting apparatus, referring to FIG. 35. First, in the step of mask-load, the following procedure is carried out. A load button is selected on the monitor display of the operation panel by an operator. In this way, a command signal is issued from the motor drive board, and on the basis of the command signal, stage 107 is moved to a load position (into the load lock). Next, the vacuum pump is operated on the basis of a command signal from the vacuum controller.

Furthermore, respective valves are opened. When the load/unload unit (load lock) falls into a vacuum state to some degree, stage 107 is moved into the work chamber by a transporter on the basis of a command signal from the motor drive board. It is recognized by a vacuum gauge controlled by the vacuum controller that the load lock falls into a vacuum state to some degree.

In the step of recipe-selection, the following procedure is carried out. When an appropriate correcting recipe is selected on the operation panel from the correcting recipes which are beforehand set, the file of the correcting recipe is read from the hard disc in the host computer to the raster generator board and so on. In this correcting recipe, there are recorded conditions such as beam current amount, pixel size, the kind and pressure of gas used in correction, and so on.

This correcting recipe is specifically shown in Table 1. In the correcting recipe, for example, working parameters for the apparatus, apparatus observation parameters, and a correcting procedure program are recorded. As the working parameters for the apparatus, shading portion forming parameters and semitransparent portion forming parameters are given.

TABLE 1

| CORRECTING RECIPE FILES No. xx | APPARATUS WORKING PARAMETERS | SHADING PORTION FORMING PARAMETERS | ACCELERATING VOLTAGE | OO V |
|---|---|---|---|---|
| | | | CURRENT AMOUNT | OO A |
| | | | WORKING PIXEL SIZE | OO μm |
| | | | GAS KIND | OO |
| | | | GAS PRESSURE | OO Torr |
| | | | CORRECTION EDGE OFFSET (FINISHING TARGET POSITION) | MINUS OO μm |
| | | | ... | |
| | | SEMITRANSPARENT PORTION FORMING PARAMETERS | ACCELERATING VOLTAGE | OO V |
| | | | CURRENT AMOUNT | OO A |
| | | | WORKING PIXEL SIZE | OO μm |
| | | | GAS KIND | OO |
| | | | GAS PRESSURE | OO Torr |
| | | | CORRECTION EDGE OFFSET (FINISHING TARGET POSITION) | MINUS OO μm |
| | | | ... | |
| | | ... | | |
| | APPARATUS OBSERVATION PARAMETERS | OBSERVATION MODE | SECONDARY ELECTRON IMAGE | SELECTION |
| | | | SECONDARY ION IMAGE | |
| | | APPARATUS PARAMETERS | ACCELERATING VOLTAGE | OO V |
| | | | CURRENT AMOUNT | OO A |
| | | | INTEGRATION NUMBER | OO |
| | CORRECTION STEP PROGRAM | STEPSxx | 1 GAIN OBSERVATION IMAGE | |
| | | | 2 DESIGNATE DEFECT | |
| | | | 3 DEPOSIT SHADING PORTION (deposition) | |
| | | | 4 FORM SEMITRANSPARENT AREAS (Ga+ IMPLANTATION) | |
| | | | 5 GAIN OBSERVATION IMAGE | |
| | | | ... | |

As the respective forming parameters, the following are recorded: the accelerating voltage of the beam, the current value of the beam, the size of a pixel for working the defect, the kind and the pressure of gas introduced into the chamber, and the correction edge offset. As the apparatus observation parameters, a secondary electron image or a secondary ion image is chosen as an observation mode. As the apparatus parameters, accelerating voltage, accelerating current, the number of integrations, and so on can be selected.

As the correcting procedure program, the order of the respective steps is described as follows: 1. observation image gain, 2. defect designation, 3. shading portion formation (deposition), 4. semitransparent portion formation (Ga$^+$ implantation), 5. observation image gain, and so on.

Next, in the step of gaining defect coordinate data, the following procedure is carried out. When a defect inspection data ID is inputted through the key board in the operation panel, a defect inspection data ID is inputted through the operation interface board to the host computer, whereby the host computer gains the coordinate data about the defect detected by the defect detector from the defect inspecting apparatus server which is isolated from the defect correcting apparatus.

Next, the following procedure is carried out in the step of coordinate origin matching. When the host computer receives the defect coordinate data from the defect inspecting apparatus server, the stage is moved to the original of the defect coordinates on the basis of a command signal from the motor drive board. The coordinate origin is designated on the observing display set in the operation panel, whereby the position of the coordinate origin is recorded in the memory in the host computer.

Next, the following procedure is carried out in the step of alignment matching. The joystick set in the operation panel is used to designate a given standard point 1 of the photomask in stage 107 as the alignment point 1 on the basis of a command signal from the motor drive board. Moreover, a given standard point 2 of the photomask in stage 107 is designated as the alignment point 2. These operations are performed on the observing display. By matching the two points of alignment point 1 and alignment point 2 to the given standard points of the defect portion, the location of the defect portion of mask substrate 104 is fixed on the observing display.

Next, the following procedure is carried out in the step of movement of stage 107 to the defect. The defect ID number is inputted through the key board of the operation panel. A data on the defect of the inputted ID number is transmitted from the host computer to the motor drive board via the operation interface board. On the basis of the transmitted data, stage 107 moves the location of the defect portion to a location where the ion beam is radiated.

In the step of defect surrounding, the following procedure is carried out. The operator designates an area so as to surround the defect on the observing display of the operation panel, thereby transmitting a control signal for designating a given scanning area from the raster generator board to the scanning amplifier.

Next, the following procedure is carried out in the step of correction start. The operator selects a correcting start switch on the monitor display of the operation panel. As a result, in the case that the use of gas is designated in the correcting recipe, the designated gas is supplied from the gas reservoir into the work chamber. By a command signal from the raster generator board, the beam blanked in the blanking amplifier is unblanked. As a result, the ion beam flied sideways falls down so as to radiate the defect portion of the photomask substrate 104. Furthermore, on the basis of a command signal from the raster generator board, the ion beam is controlled by the scanning amplifier. Therefore, the ion beam is scanned only on the area where correction is required.

Next, the following procedure is carried out in the step of unload. The operator pushes an unload button on the monitor display of the operation panel, whereby the motor drive board moves stage 107 to an unload position inside the load/unload (load lock). On the basis of a command signal from the vacuum controller, the vacuum pump is operated. Furthermore, the respective valves are closed. When the inside of the load/unload (load lock) turns into some vacuum degree, stage 107 is moved to the outside of the work chamber by the transporter on the basis of a command signal from the motor driver board. As a result, all the procedures finish. It is recognized by the vacuum gauge controlled by the vacuum controller that the inside of the load lock turns into some vacuum degree.

The data inputted from the defect inspecting apparatus server into the host computer includes, for example, defect coordinate data files shown in Table 2. ID numbers is assigned to each defect coordinate data file. In each data file, the following record data are recorded: inspection ID, the coordinate origin position at the time of inspection, the ID number of defects, and the coordinates of the defect and the classification of the shape of the defect (clear defect, opaque defect or the like).

TABLE 2

| DEFECT COORDINATE DATA FILES No. xx | INSPECTION ID |
|---|---|
| | RECORD OF COORDINATE ORIGIN POSITION AT THE TIME OF INSPECTION |
| | DEFECT ID NUMBER |
| | DEFECT COORDINATES |
| | RECORD OF DEFECT SHAPE CLASSIFICATION (CLEAR OR OPAQUE DEFECT) |
| | ... |

Referring to FIGS. 33 to 35, the control system of the FIB radiating apparatus has been described. However, if the ion beam optics, the blanking amplifier and the scanning amplifier in FIG. 33 can be replaced by laser oscillator 210, mirror 211, half mirror 212 and 213, and so on, the same control system as for the FIB radiating device in FIG. 33 except the replaced units is used to make it possible to exhibit the function of the laser CVD illustrated in FIG. 32.

Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. A method for producing the half tone mask comprising:
a transparent substrate;
a semitransparent film or shading film provided on the transparent substrate;
a clear defect portion being a missing portion of a complete pattern that should be formed when it is assumed that the semitransparent film or shading film is completely well formed;
a shading portion, having a transmissivity of 0 to 2% or 2 to 6%, provided in the clear defect portion; and
a semitransparent portion, formed at the peripheral portion of the shading portion, having a transmissivity larger than that of said shading portion
wherein
said shading portion is a first deposition film deposited by FIB radiation,
said semitransparent portion is a second deposition film deposited by FIB radiation and having a film thickness smaller than that of said first deposition film.

2. A method for producing the half tone mask comprising:
a transparent substrate;
a semitransparent film or shading film provided on the transparent substrate;
a clear defect portion being a missing portion of a complete pattern that should be formed when it is assumed that the semitransparent film or shading film is completely well formed;
a shading portion, having a transmissivity of 0 to 2% or 2 to 6%, provided in the clear defect portion; and
a semitransparent portion, formed at the peripheral portion of the shading portion, having a transmissivity larger than that of said shading portion
wherein
said semitransparent portion is formed by implanting metal ions into said transparent substrate by FIB radiation.

3. The method for producing the half tone mask according to claim 2, wherein
said semitransparent portion is formed by etching said transparent substrate with said FIB radiation.

4. The method for producing the half tone mask according to claim 3, wherein
conditions for said FIB radiation are set in such a manner that the etching depth d of said semitransparent portion by said FIB radiation is substantially a value even-number times larger than $d=\lambda/2(n-1)$, where $\lambda$ is the exposure wave length and n is the refraction index of the transparent substrate.

5. The method for producing the half tone mask according to claim 2, wherein
said FIB radiation is performed in a chamber (1000), and when said semitransparent portion is formed by metal ion implantation using said FIB radiation, gas for suppressing the etching of said transparent substrate is introduced into atmosphere in said chamber.

6. A method for producing the half tone mask comprising:
a transparent substrate;
a semitransparent film or shading film provided on the transparent substrate;
a clear defect portion being a missing portion of a complete pattern that should be formed when it is assumed that the semitransparent film or shading film is completely well formed:
a shading portion, having a transmissivity of 0 to 2% or 2 to 6%, provided in the clear defect portion; and
a semitransparent portion, formed at the peripheral portion of the shading portion, having a transmissivity larger than that of said shading portion
wherein
said semitransparent portion or shading portion is formed by using FIB radiation to roughen the surface of said transparent substrate.

7. A method for producing the halftone mask comprising:
a transparent substrate;
a semitransparent film or shading film provided on the transparent substrate;
a clear defect portion being a missing portion of a complete pattern that should be formed when it is assumed that the semitransparent film or shading film is completely well formed;
a shading portion, having a transmissivity of 0 to 2% or 2 to 6%, provided in the clear defect portion; and
a semitransparent portion, formed at the peripheral portion of the shading portion, having a transmissivity larger than that of said shading portion
wherein
said shading portion is a first deposition film deposited by laser CVD, and
said semitransparent portion is a second deposition film deposited by laser CVD and having a second film thickness smaller than that of said first deposition film.

8. A defect correcting apparatus for correcting a clear defect in a half tone mask wherein a semitransparent film or first shading film is formed on a transparent substrate, comprising:
- a detector for detecting the location, shape and dimension of a pattern of said semitransparent film or said first shading film;
- comparing means for comparing the pattern detected by the detector with an imaginary pattern that should be formed when it is assumed that a pattern which should be originally formed is completely formed;
- a radiation source for radiating a focused ion beam or laser beam to an area necessary for correcting said clear defect portion generated in said pattern, the area being recognized on the basis of comparative results from the comparing means;
- a gas supplying mechanism for supplying, into said clear defect portion, gas for depositing a second shading film having a transmissivity of almost 0 to 2% or 2 to 6%; and
- control means for controlling a location where said focused ion beam or laser beam is radiated onto said half tone mask, wherein the control means has therein a program for carrying out a control for radiating said focused ion beam or laser beam onto said transparent substrate in such a manner that after the deposition of said second shading film, a semi-transparent portion having a larger transmissivity than said second shading film is formed in the peripheral portion of the second shading film.

* * * * *